(12) United States Patent
Lee et al.

(10) Patent No.: US 12,451,449 B2
(45) Date of Patent: Oct. 21, 2025

(54) SEMICONDUCTOR PACKAGE, AND METHOD OF MANUFACTURING THE SAME

(71) Applicant: SAMSUNG ELECTRONICS CO., LTD., Suwon-si (KR)

(72) Inventors: Wonil Lee, Hwaseong-si (KR); Minki Kim, Suwon-si (KR); Jihoon Kim, Cheonan-si (KR); Gwangjae Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 428 days.

(21) Appl. No.: 17/896,638

(22) Filed: Aug. 26, 2022

(65) Prior Publication Data

US 2023/0141447 A1 May 11, 2023

(30) Foreign Application Priority Data

Nov. 11, 2021 (KR) ........................ 10-2021-0154537

(51) Int. Cl.
*H01L 23/00* (2006.01)
*H01L 25/065* (2023.01)

(52) U.S. Cl.
CPC ............ *H01L 24/05* (2013.01); *H01L 24/03* (2013.01); *H01L 24/08* (2013.01); *H01L 24/80* (2013.01); *H01L 24/94* (2013.01); *H01L 24/97* (2013.01); *H01L 25/0652* (2013.01); *H01L 25/0657* (2013.01); *H01L 24/16* (2013.01); *H01L 2224/03616* (2013.01);
(Continued)

(58) Field of Classification Search
CPC ...... H01L 24/05; H01L 24/08; H01L 25/0652
See application file for complete search history.

(56) References Cited

U.S. PATENT DOCUMENTS 9,653,623 B2   5/2017  Hong et al.
9,761,463 B2   9/2017  Tanida et al.
(Continued)

FOREIGN PATENT DOCUMENTS

JP   2016-181531 A     10/2016
KR   10-2020-0059516 A  5/2020
KR   10-2021-0025156 A  3/2021

OTHER PUBLICATIONS

Communication issued Aug. 21, 2025 by the Korean Intellectual Property Office in Korean Patent Application No. 10-2021-0154537.

*Primary Examiner* — Dale E Page
*Assistant Examiner* — Wilner Jean Baptiste
(74) *Attorney, Agent, or Firm* — Sughrue Mion, PLLC

(57) ABSTRACT

A semiconductor package is provided in which a first insulating layer includes a first recess spaced apart from a first pad in a first direction, and a second insulating layer includes a second recess spaced apart from a second pad in the first direction and overlapping at least a portion of the first recess in a second direction, perpendicular to the first direction, to provide an air gap together with the first recess. The semiconductor package further includes a first bonding surface defined by the first and second insulating layers contacting each other on one side of the air gap, adjacent to the first and second pads, and a second bonding surface defined by the first and second insulating layers contacting each other on another side of the air gap, opposite to the one side.

20 Claims, 29 Drawing Sheets

(52) U.S. Cl.
CPC .............. *H01L 2224/05015* (2013.01); *H01L 2224/05018* (2013.01); *H01L 2224/05073* (2013.01); *H01L 2224/05166* (2013.01); *H01L 2224/05187* (2013.01); *H01L 2224/05541* (2013.01); *H01L 2224/05555* (2013.01); *H01L 2224/05557* (2013.01); *H01L 2224/05578* (2013.01); *H01L 2224/05647* (2013.01); *H01L 2224/05687* (2013.01); *H01L 2224/08121* (2013.01); *H01L 2224/08145* (2013.01); *H01L 2224/16227* (2013.01); *H01L 2224/16238* (2013.01); *H01L 2224/80204* (2013.01); *H01L 2224/80895* (2013.01); *H01L 2224/80896* (2013.01); *H01L 2224/95001* (2013.01); *H01L 2225/06524* (2013.01); *H01L 2225/06527* (2013.01); *H01L 2225/06544* (2013.01); *H01L 2924/1431* (2013.01); *H01L 2924/1434* (2013.01); *H01L 2924/35121* (2013.01)

(56) References Cited

U.S. PATENT DOCUMENTS

| | | | |
|---|---|---|---|
| 9,786,628 | B2 | 10/2017 | Chou et al. |
| 10,770,424 | B1 | 9/2020 | Shih |
| 10,840,204 | B2 * | 11/2020 | Kawasaki ............... H01L 24/08 |
| 10,854,574 | B2 | 12/2020 | Chen et al. |
| 11,031,285 | B2 | 6/2021 | Katkar et al. |
| 2014/0353828 | A1 * | 12/2014 | Edelstein ................ H01L 24/03 257/751 |
| 2016/0126136 | A1 * | 5/2016 | Ashidate ............ H01L 27/1469 438/456 |
| 2016/0197049 | A1 | 7/2016 | Chen et al. |
| 2020/0161277 | A1 | 5/2020 | Lee et al. |
| 2021/0066224 | A1 | 3/2021 | Jang et al. |
| 2021/0151406 | A1 | 5/2021 | Kanda |
| 2021/0217716 | A1 | 7/2021 | Wu et al. |

* cited by examiner

SEMICONDUCTOR PACKAGE, AND METHOD OF MANUFACTURING THE SAME

CROSS-REFERENCE TO RELATED APPLICATION

This application is based on and claims priority to Korean Patent Application No. 10-2021-0154537 filed on Nov. 11, 2021 in the Korean Intellectual Property Office, the disclosure of which is incorporated herein by reference in its entirety.

BACKGROUND

Embodiments of the present disclosure relate to a semiconductor package and a method for manufacturing the same.

As demand for high-capacity, thinned, and small electronic products increases, various types of semiconductor packages are being developed. Recently, as a method to integrate more components (e.g., semiconductor chips) into a package structure, a direct bonding technology of joining semiconductor chips without an adhesive film (e.g., a non-conductive film (NCF)) or connecting bumps (e.g., solder balls) has been developed.

SUMMARY

According to an aspect of the present disclosure, a semiconductor package having improved reliability, and a method for manufacturing the semiconductor package are provided.

According to embodiments of the present disclosure, a semiconductor package is provided. The semiconductor package includes: a first semiconductor chip comprising a first substrate, a first pad above the first substrate, and a first insulating layer above the first substrate and surrounding the first pad; and a second semiconductor chip on the first semiconductor chip, the second semiconductor chip comprising a second substrate, a second pad below the second substrate and contacting the first pad, and a second insulating layer below the second substrate, surrounding the second pad, and contacting the first insulating layer, wherein the first insulating layer comprises a first recess spaced apart from the first pad in a first direction, wherein the second insulating layer comprises a second recess spaced apart from the second pad in the first direction, the second recess overlapping at least a portion of the first recess in a second direction, perpendicular to the first direction, with an air gap between the first recess and the second recess, and wherein the semiconductor package further comprises a first bonding surface that is defined by the first insulating layer and the second insulating layer contacting each other on one side of the air gap, adjacent to the first pad and the second pad, and the semiconductor package further comprises a second bonding surface that is defined by the first insulating layer and the second insulating layer contacting each other on another side of the air gap, that is opposite to the one side.

According to embodiments of the present disclosure, a semiconductor package is provided. The semiconductor package includes: a first semiconductor chip comprising a first substrate, a plurality of first pads above the first substrate, and a first insulating layer above the first substrate and surrounding the plurality of first pads, a second semiconductor chip on the first semiconductor chip, the second semiconductor chip comprising a second substrate, a plurality of second pads below the second substrate, and a second insulating layer below the second substrate and surrounding the plurality of second pads, wherein the first semiconductor chip and the second semiconductor chip are electrically connected to each other by a pair of a first bonding pad structure and a second bonding pad structure that each comprise one of the plurality of first pads and one of the plurality of second pads, wherein the semiconductor package further comprises a first air gap that surrounds the first bonding pad structure, and a second air gap that surrounds the second bonding pad structure, and wherein the semiconductor package further comprises: first bonding surfaces that are defined by at least a portion of the first insulating layer and at least a portion of the second insulating layer that are in contact with each other, between the first bonding pad structure and the first air gap and between the second bonding pad structure and the second air gap; and a second bonding surface that is defined by at least a portion of the first insulating layer and at least a portion of the second insulating layer that are in contact with each other, between the first air gap and the second air gap.

According to embodiments of the present disclosure, a semiconductor package is provided. The semiconductor package includes: a first semiconductor chip comprising a first substrate, a first pad above the first substrate, and a first insulating layer comprising a first recess that surrounds the first pad; and a second semiconductor chip on the first semiconductor chip, the second semiconductor chip comprising a second substrate, a second pad below the second substrate and contacting the first pad, and a second insulating layer comprising a second recess that surrounds the second pad, wherein the second insulating layer contacts the first insulating layer, and wherein a side surface of each of the first pad and the second pad is entirely covered with the first insulating layer and the second insulating layer, respectively.

According to embodiments of the present disclosure, a method for manufacturing a semiconductor package is provided. The method includes: preparing a semiconductor wafer comprising a preliminary substrate, a circuit layer on a front surface of the preliminary substrate, and a preliminary insulating layer on the circuit layer; forming a front insulating layer comprising an etching groove by etching at least a portion of the preliminary insulating layer; forming a preliminary barrier layer and a preliminary conductive layer on the front insulating layer, including on the etching groove; forming a front pad comprising a barrier layer and a conductive layer by polishing the preliminary barrier layer and the preliminary conductive layer in a polishing process using a first slurry; and forming a recess spaced apart from the front pad by a predetermined distance by polishing the front insulating layer in a polishing process using a second slurry.

According to embodiments of the present disclosure, a method for manufacturing a semiconductor package is provided. The method includes: preparing a semiconductor wafer comprising a preliminary substrate and a plurality of through-electrodes arranged in the preliminary substrate; forming a substrate having a rear surface from which the plurality of through-electrodes protrude by removing a portion of the preliminary substrate; forming a preliminary protective layer and a preliminary buffer layer that are on the plurality of through-electrodes on the rear surface of the substrate; forming a flat surface, from which the plurality of through-electrodes are exposed, by planarizing the preliminary protective layer and the preliminary buffer layer; forming a preliminary insulating layer on the flat surface; forming a rear insulating layer comprising an etching groove by etching at least a portion of the preliminary insulating layer; forming a preliminary barrier layer and a preliminary conductive layer on the rear insulating layer, including on the etching groove; forming a rear pad comprising a barrier layer and a conductive layer by polishing the preliminary barrier layer and the preliminary conductive layer in a polishing process using a first slurry; and forming a recess spaced apart from the rear pad by a predetermined distance by polishing the rear insulating layer in a polishing process using a second slurry.

According to embodiments of the present disclosure, a method for manufacturing a semiconductor package is provided. The method includes: preparing a semiconductor wafer comprising a plurality of rear pads and a rear insulating layer surrounding the plurality of rear pads, the rear insulating layer comprising first recesses spaced apart from the plurality of rear pads; preparing a plurality of second semiconductor chips comprising a plurality of front pads and a front insulating layer surrounding the plurality of front pads, the front insulating layer comprising second recesses spaced apart from the plurality of front pads; forming an air gap between the first recesses and the second recesses by disposing the plurality of second semiconductor chips on the semiconductor wafer, the plurality of rear pads contacting the plurality of front pads, and the rear insulating layer contacting the front insulating layer in a remaining portion of the front insulating layer that excludes the air gap; and bonding the rear insulating layer and the front insulating layer to each other and bonding the plurality of rear pads and the plurality of front pads to each other by performing a thermal compression process.

BRIEF DESCRIPTION OF DRAWINGS

The above and other aspects, features, and advantages of embodiments of the present disclosure will be more clearly understood from the following detailed description, taken in conjunction with the accompanying drawings, in which.

DETAILED DESCRIPTION

Hereinafter, embodiments of the present disclosure will be described with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1A:
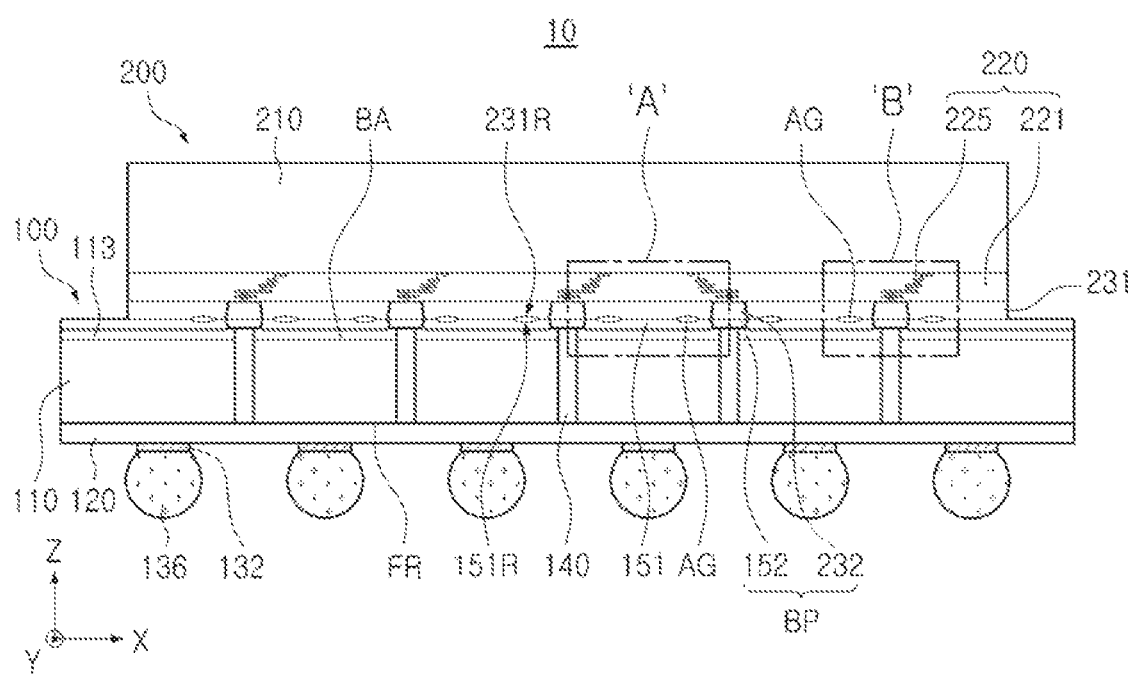
FIG. 1A is a cross-sectional view illustrating a semiconductor package according to an embodiment of the present disclosure.
Figure 1B:
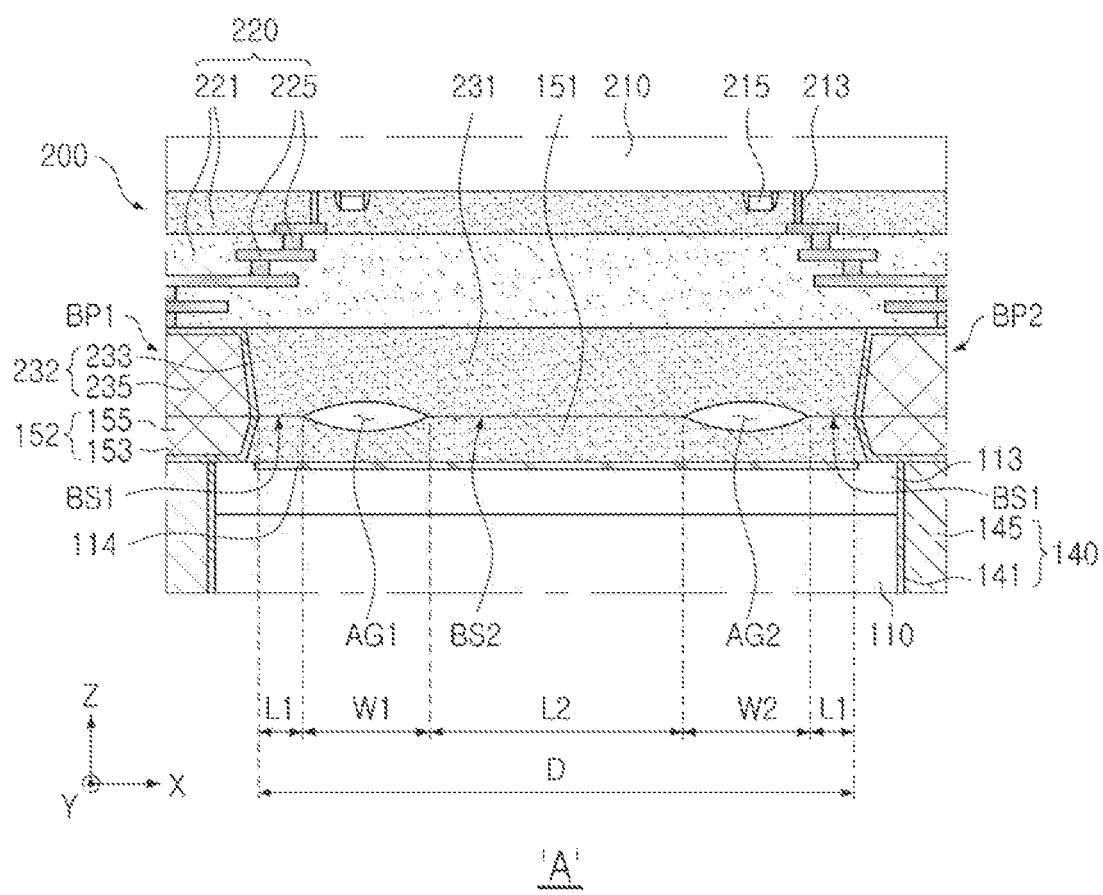
FIG. 1B is a partially enlarged view illustrating portion 'A' of FIG. 1A.
Figure 1C:
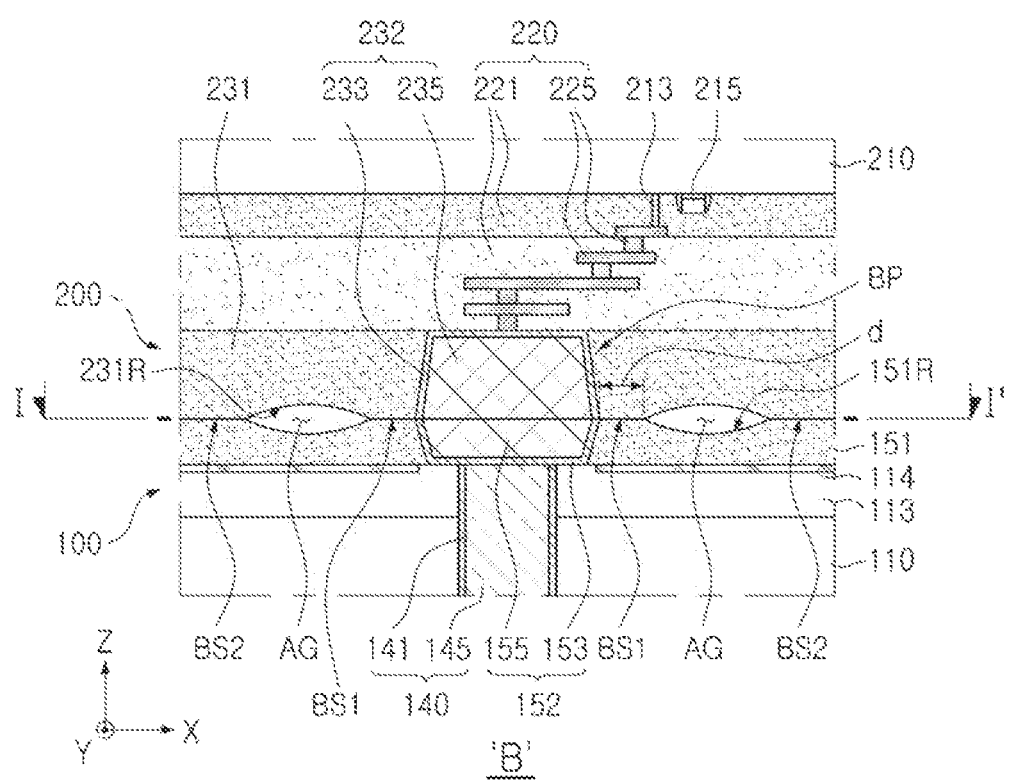
FIG. 1C is a partially enlarged view illustrating portion 'B' of FIG. 1A.
Figure 1D:
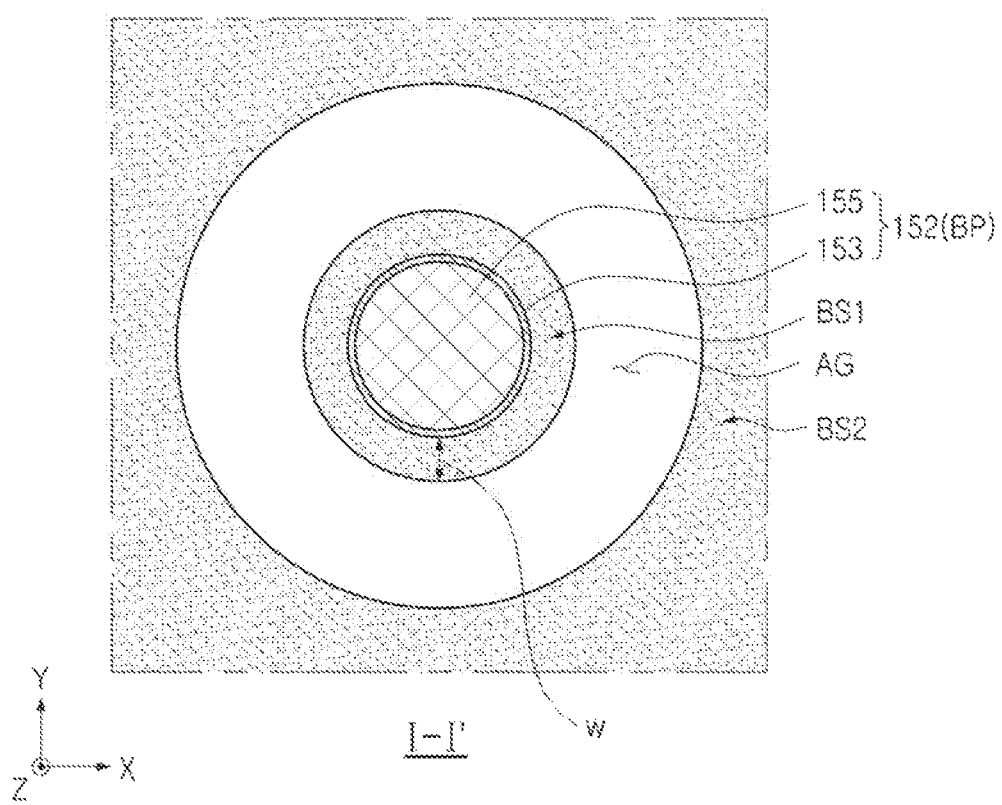
FIG. 1D is a first plan view of FIG. 1C, taken along line I-I'.
Figure 1E:
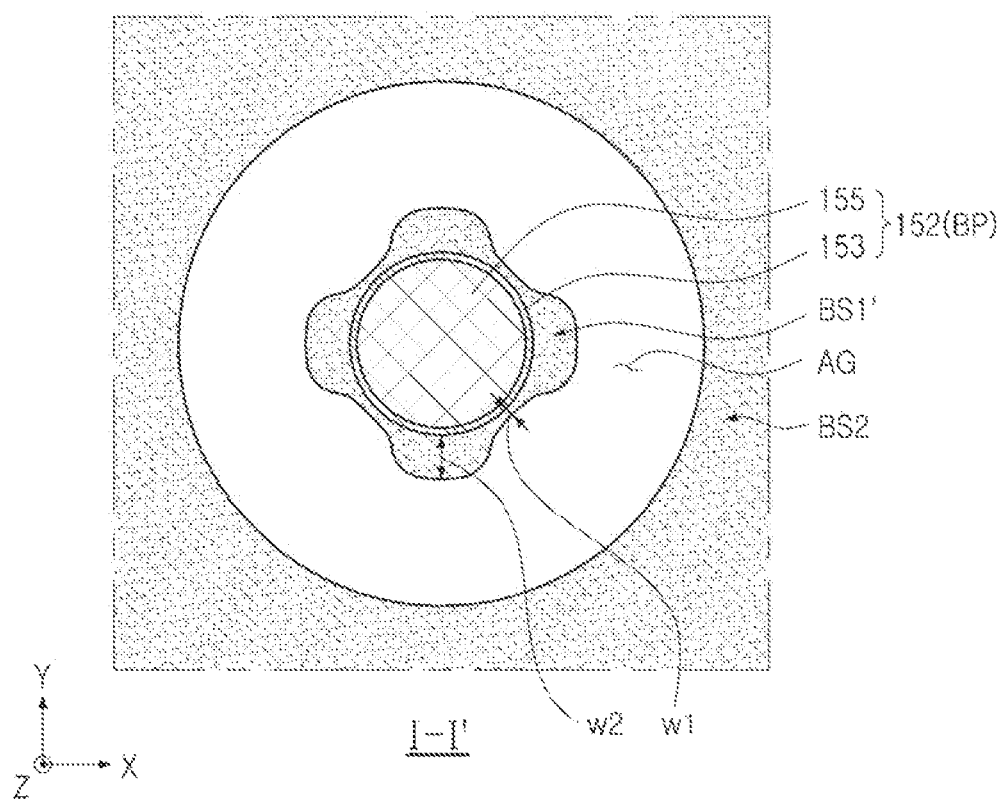
FIG. 1E is a second plan view of FIG. 1C, taken along line I-I'.

FIG. 1A is a cross-sectional view illustrating a semiconductor package according to an embodiment of the present disclosure, FIG. 1B is a partially enlarged view illustrating portion 'A' of FIG. 1A, FIG. 1C is a partially enlarged view illustrating portion 'B' of FIG. 1A, and FIGS. 1D and 1E are plan views of FIG. 1C, taken along line I-I'.

Referring to FIG. 1A, a semiconductor package 10 according to an embodiment may include a plurality of semiconductor chips stacked in a vertical direction (a Z-axis direction), for example, a first semiconductor chip 100 and a second semiconductor chip 200. An upper surface of the first semiconductor chip 100 and a lower surface of the second semiconductor chip 200 may be directly joined and bonded (e.g., hybrid bonding, direct bonding, or the like) without a connecting member such as a metal bump or the like. A first insulating layer 151 and first pads 152, providing the upper surface of the first semiconductor chip 100, may be joined and bonded to a second insulating layer 231 and second pads 232, providing the lower surface of the second semiconductor chip 200. The first semiconductor chip 100 may be electrically connected to the second semiconductor chip 200 by bonding pad structures BP that include the first pads 152 and the second pads 232 that are joined.

Embodiments of the present disclosure may include air gaps AG surrounding the bonding pad structures BP between the first insulating layer 151 and the second insulating layer 231, to trap gas generated in a thermal compression process, and prevent interfacial delamination or occurrence of a void. In addition, the air gaps AG may be spaced apart from the bonding pad structures BP by a predetermined distance, to form a junction interface (or 'bonding surface') of the first insulating layer 151 and the second insulating layer 231 between the bonding pad structures BP and the air gaps AG, thereby improving joining quality between the first pads 152 and the second pads 232.

For example, at least a portion of the first insulating layer 151 may be located between a side surface of at least one of the first pads 152 and a first recess 151R, and at least a portion of the second insulating layer 231 may be located between a side surface of at least one of the second pads 232 and a second recess 231R. In this case, the at least portion of the first insulating layer 151 may be in contact with the at least portion of the second insulating layer. Therefore, the side surface of the at least one of the first pads 152 and the side surface of the at least one of the second pads 232 may be entirely covered with the first insulating layer 151 and the second insulating layer 231, respectively, and may not be exposed from the first recess 151R and the second recess 231R, respectively. In this case, the "first insulating layer" and the "second insulating layer" may be referred to as a "first upper insulating layer" or a "first rear insulating layer" and a "second lower insulating layer" or a "second front insulating layer," to distinguish positions of components in the first semiconductor chip 100 or the second semiconductor chip 200, respectively. Also, the "first pad" and the "second pad" may be referred to as a "first upper pad" or a "first rear pad" and a "second lower pad" or a "second front pad," respectively.

Hereinafter, components of the first semiconductor chip 100 and the second semiconductor chip 200 will be described in detail with reference to FIGS. 1B to 1E along with FIG. 1A.

The first semiconductor chip 100 may include a first substrate 110, a first circuit layer 120, first through-electrodes 140, a first insulating layer 151, and first pads 152. The first semiconductor chip 100 may have a flat upper surface provided by an upper surface of the first insulating layer 151 and upper surfaces of the first pads 152. For example, the upper surface of the first insulating layer 151, except for a first recess 151R, may be substantially coplanar with the upper surfaces of the first pads 152, exposed from the first insulating layer 151.

The first substrate 110 may be a semiconductor wafer substrate having a front surface FR and a rear surface BA, opposite to each other. For example, the first substrate 110 may be a semiconductor wafer including a semiconductor element such as silicon or germanium, or a compound semiconductor such as silicon carbide (SiC), gallium arsenide (GaAs), indium arsenide (InAs), or indium phosphide (InP). The front surface FR may be an active surface having an active region doped with impurities, and the rear surface BA may be an inactive surface located opposite to the front surface FR. An insulating protective layer 113 electrically insulating the first pads 152 and the first substrate 110 may be disposed on the rear surface BA of the first substrate 110. For example, the insulating protective layer 113 may include silicon oxide (SiO), silicon nitride (SiN), silicon carbide (SiC), silicon oxynitride (SiON), or silicon carbonitride (SiCN). A buffer layer 114 such as an abrasive stop layer or a barrier may be disposed on an upper surface of the insulating protective layer 113. For example, the buffer layer 114 may include silicon nitride, silicon carbide, silicon oxynitride, or silicon carbonitride.

The first circuit layer 120 may be disposed on the front surface FR of the first substrate 110, and may include a first wiring structure (not illustrated) connected to the active region and a first interlayer insulating layer (not illustrated) surrounding the first wiring structure. First pads 132 electrically connected to a wiring structure (not illustrated) may be disposed below the first circuit layer 120. The first pads 132 may be pad structures electrically connected to a wiring structure (not illustrated). A connection bump 136 may be disposed below one of the first pads 132. The connection bump 136 may be, for example, a conductive bump structure including a solder ball, a copper (Cu) post, or the like. The first circuit layer 120 may have a structure identical or similar to a structure of the second circuit layer 220 illustrated in FIGS. 1B and 1C, and the like. Therefore, it can be understood that the first wiring structure (not illustrated) and the first interlayer insulating layer (not illustrated) have similar characteristics to a second wiring structure 225 and a second interlayer insulating layer 221 of a second circuit layer 220 to be described later. In addition, referring to a modified example of FIG. 7, structures of the first wiring structure (e.g., first wiring structure 125 in FIG. 7) and the first interlayer insulating layer (e.g., first interlayer insulating layer 121 in FIG. 7) of the first circuit layer 120 can be easily understood.

The first through-electrodes 140 may pass through the first substrate 110 and the insulating protective layer 113 to electrically connect at least one of the first pads 152 and at least one of the first pads 132. The first through-electrodes 140 may include a via plug 145 and a side barrier layer 141 surrounding a side surface of the via plug 145. The via plug 145 may include, for example, tungsten (W), titanium (Ti), aluminum (Al), or copper (Cu), and may be formed in a plating process, a physical vapor deposition (PVD) process, or a chemical vapor deposition (CVD) process. The side barrier layer 141 may include titanium (Ti), titanium nitride (TiN), tantalum (Ta), or tantalum nitride (TaN), and may be formed in a plating process, a PVD process, or a CVD process. A side insulating layer (not illustrated) including an insulating material (e.g., a high aspect ratio process (HARP) oxide) such as silicon oxide, silicon nitride, silicon oxynitride, or the like may be formed between the side barrier layer 141 and the first substrate 110.

The first insulating layer 151 may be disposed on the rear surface BA of the first substrate 110. The first insulating layer 151 may include an insulating material capable of joining and bonding to a second insulating layer 231 in a lower portion of the second semiconductor chip 200. For example, the first insulating layer 151 may include silicon oxide (SiO) or silicon carbonitride (SiCN). For example, at least a portion of the first insulating layer 151 may be joined to the second insulating layer 231, to form bonding surfaces (e.g., a first bonding surface BS1 and a second bonding surface BS2) for joining and bonding the first semiconductor chip 100 and the second semiconductor chip 200 to each other. In addition, the first insulating layer 151 may be formed to surround a plurality of first pads 152 (also referred to as 'upper pads') arranged on the upper surface thereof, and may be spaced apart from the plurality of first pads 152 by a predetermined distance, to have a plurality of the first recess 151R surrounding the plurality of first pads 152. The plurality of the first recess 151R may be vertically aligned with a plurality of the second recess 231R of the second semiconductor chip 200, to form an air gap AG surrounding a bonding pad structure BP. In this case, the first insulating layer 151 may be referred to as a first upper insulating layer.

The first pads 152 may be disposed above the rear surface BA of the first substrate 110, and may include a first barrier layer 153 and a first conductive layer 155. At least a portion of one of the first pads 152 may be joined to one of the second pads 232 of the second semiconductor chip 200, to form the bonding pad structure BP and a bonding surface (bonding surface BS3 in FIG. 13) for physically and electrically bonding the first semiconductor chip 100 and the second semiconductor chip 200. The first barrier layer 153 may be formed to conformally extend between the first conductive layer 155 and the first insulating layer 151, to surround an outer edge of the first conductive layer 155. The first conductive layer 155 and the first barrier layer 153 may include a conductive material. For example, the first conductive layer 155 may include at least one of copper (Cu), nickel (Ni), gold (Au), and silver (Ag), and the first barrier layer 153 may include at least one of titanium (Ti), titanium nitride (TiN), tantalum (Ta), and tantalum nitride (TaN).

The second semiconductor chip 200 may be disposed on the first semiconductor chip 100, and may include a second substrate 210, a second circuit layer 220, a second insulating layer 231, and second pads 232 (also referred to as 'second lower pads'). The second semiconductor chip 200 may have a flat lower surface provided by a lower surface of the second insulating layer 231 and lower surfaces of the second pads 232. For example, the lower surface of the second insulating layer 231, except for a second recess 231R, may be substantially coplanar with the lower surfaces of the second pads 232, exposed from the second insulating layer 231. Since the first semiconductor chip 100 and the second semiconductor chip 200 may have substantially the same or similar structures, the same or similar components may be denoted by the same or similar reference numerals, and overlapping description of the same components will be omitted. For example, it can be understood that the second substrate 210 has substantially the same characteristics as the first substrate 110, described above.

The second circuit layer 220 may be disposed on a front surface or an active surface of the second substrate 210 and may include a second wiring structure 225 connected to an active region, and a second interlayer insulating layer 221 surrounding the second wiring structure 225.

The second interlayer insulating layer 221 may include flowable oxide (FOX), tonen silazen (TOSZ), undoped silica glass (USG), borosilica glass (BSG), phosphosilaca glass (PSG), borophosphosilica glass (BPSG), plasma enhanced tetra ethyl ortho silicate (PETEOS), fluoride silicate glass (FSG), high density plasma (HDP) oxide, plasma enhanced oxide (PEOX), flowable CVD (FCVD) oxide, or a combination thereof. At least a portion of the second interlayer insulating layer 221 surrounding the second wiring structure 225 may be formed as a low dielectric layer. The second interlayer insulating layer 221 may be formed using a CVD process, a flowable-CVD process, or a spin coating process.

The second wiring structure 225 may be formed in a multi-layer structure including a via and a wiring pattern including, for example, aluminum (Al), gold (Au), cobalt (Co), copper (Cu), nickel (Ni), lead (Pb), tantalum (Ta), tellurium (Te), titanium (Ti), tungsten (W), or a combination thereof. A barrier layer (not illustrated) including titanium (Ti), titanium nitride (TiN), tantalum (Ta), or tantalum nitride (TaN) may be disposed between the wiring pattern and/or the via and the second interlayer insulating layer 221. Individual devices 215 constituting an integrated circuit may be disposed on the front surface of the second substrate 210. In this case, the second wiring structure 225 may be electrically connected to the individual devices 215 through an interconnection portion 213 (e.g., a contact plug). The individual devices 215 may include a field effect transistor (FET) such as a planar FET, a FinFET, or the like, a memory device such as a flash memory, a dynamic random access memory (DRAM), a static random access memory (SRAM), an electrically erasable programmable read-only memory (EEPROM), a parameter random access memory (PRAM), a magnetoresistive random-access memory (MRAM), a ferroelectric random access memory (FeRAM), a resistive random access memory (RRAM), or the like, a logic device such as an AND, an OR, an NOT, or the like, or various active and/or passive components such as a system large scale integration (LSI), a customer information system (CIS), or a micro-electromechanical system (MEMS).

The second insulating layer 231 may be disposed below the second substrate 210 or the second circuit layer 220. The second insulating layer 231 may include an insulating material capable of joining and bonding to the first insulating layer 151 of the first semiconductor chip 100. For example, the second insulating layer 231 may include silicon oxide (SiO) or silicon carbonitride (SiCN). For example, at least a portion of the second insulating layer 231 may be joined to the first insulating layer 151, to form the bonding surfaces (e.g., the first bonding surface BS1 and the second bonding surface BS2) for joining and bonding the first semiconductor chip 100 and the second semiconductor chip 200 to each other. In addition, the second insulating layer 231 may be formed to surround a plurality of second pads 232 arranged on the lower surface thereof, and may be spaced apart from the plurality of second pads 232 by a predetermined distance, to have a plurality of the second recess 231R surrounding the plurality of second pads 232. The plurality of the second recess 231R may be vertically aligned with the plurality of the first recess 151R of the first semiconductor chip 100, to form the air gap AG surrounding the bonding pad structure BP. In this case, the second insulating layer 231 may be referred to as a second lower insulating layer.

The second pads 232 may be disposed below the second substrate 210, and may include a second barrier layer 233 and a second conductive layer 235. At least a portion of one of the second pads 232 may be joined to one of the first pads 152 of the first semiconductor chip 100, to form the bonding pad structure BP and a bonding surface (bonding surface BS3 in FIG. 13) for physically and electrically bonding the first semiconductor chip 100 and the second semiconductor chip 200. The second barrier layer 233 and the second conductive layer 235 may be formed of the same or similar structure and material to the first barrier layer 153 and the first conductive layer 155, described above.

As described above, the first recess 151R of the first insulating layer 151 and the second recess 231R of the second insulating layer 231 may provide the air gap AG surrounding the bonding pad structure BP. The air gap AG may be spaced apart from the bonding pad structure BP by a predetermined distance, to improve quality of a junction interface between the first semiconductor chip 100 and the second semiconductor chip 200 and enhance reliability of the semiconductor package 10. Hereinafter, the first bonding surface BS1 and the second bonding surface BS2 formed around the bonding pad structure BP and the air gap AG will be described in more detail.

As illustrated in FIG. 1B, the semiconductor package 10 of the present embodiment may include at least a pair of a first bonding pad structure BP1 and a second bonding pad structure BP2, adjacent to each other, among a plurality of the bonding pad structure BP electrically connecting the first semiconductor chip 100 and the second semiconductor chip 200.

The at least one pair of the first bonding pad structure BP1 and the second bonding pad structure BP2 may be conductive structures in which the plurality of first pads 152 and the plurality of second pads 232 are joined and bonded to each other. In this case, between the at least one pair of the first bonding pad structure BP1 and the second bonding pad structure BP2, a first air gap AG1 adjacent to the first bonding pad structure BP1, a second air gap AG2 adjacent to the second bonding pad structure BP2, a plurality of the first bonding surface BS1 located between the first bonding pad structure BP1 and the first air gap AG1, and between the second bonding pad structure BP2 and the second air gap AG2, and a second bonding surface BS2 located between the first air gap AG1 and the second air gap AG2 may be formed.

The first gap AG1 may be spaced apart from the first bonding pad structure BP1 by a predetermined distance, to surround the first bonding pad structure BP1. The second gap AG2 may be spaced apart from the second bonding pad structure BP2 by a predetermined distance, to surround the second bonding pad structure BP2. The plurality of the first bonding surface BS1 may be junction interfaces between the first insulating layer 151 (also referred to as a 'first upper insulating layer') and the second insulating layer 231 (also referred to as a 'second lower insulating layer'), joined between the first bonding pad structure BP1 and the first air gap AG1 and joined between the second bonding pad structure BP2 and the second air gap AG2. The second bonding surface BS2 may be a junction interface between the first insulating layer 151 and the second insulating layer 231, joined between the first air gap AG1 and the second air gap AG2.

The first air gap AG1 and the second air gap AG2 may trap gas generated during bonding between the first semiconductor chip 100 and the second semiconductor chip 200, and may prevent interfacial delamination or occurrence of a void. A width W1 of the first air gap AG1 and a width W2 of the second air gap may be about 25% or less, e.g., about 5% to about 25%, about 10% to about 25%, or about 15% to about 25% of a distance D between the first bonding pad structure BP1 and the second bonding pad structure BP2 (also referred to as a 'pad interval'), respectively. When the width W1 of the first air gap AG1 and the width W2 of the second air gap are less than about 5% of the distance D, respectively, the gas trapping effect may be insignificant. When the width W1 of the first air gap AG1 and the width W2 of the second air gap exceed about 25% of the distance D, respectively, sufficient bonding force between the first insulating layer 151 and the second insulating layer 231 may not be secured. The bonding force between the first insulating layer 151 and the second insulating layer 231 may be secured by the second bonding surface BS2. For example, the second bonding surface BS2 may have a length L2 equal to or greater than a sum of the width W1 of the first air gap AG1 and the width W2 of the second air gap AG2. The plurality of the first bonding surface BS1 may be provided to support and fix the first pads 152 and the second pads 232 in a bonding process (e.g., a thermal compression process) and secure their joining reliability, and may thus formed to have a length L1, relatively shorter than that of the second bonding surface BS2. For example, each of the plurality of the first bonding surface BS1 may have the length L1 that may be smaller than the width W1 of the first air gap and the width W2 of the second air gap. In this case, the length L1 of each of the plurality of the first bonding surface BS1 may refer to a width (width w in FIG. 1D) of a junction interface between the first insulating layer 151 and the second insulating layer 231, between the bonding pad structure BP and the air gap AG.

For example, when the distance D (also referred to as a 'pad interval') is about 2 the width W1 and the width W2 of the first air gap AG1 and the second air gap AG2 may be in the range of about 0.1 μm to about 0.5 respectively, the length L2 of the second bonding surface BS2 may be in the range of about 1 μm to about 1.8 and the length L1 of each of the plurality of the first bonding surface BS1 may be in the range of about 0.1 nm to about 100 nm. In this case, since the length L1 of each of the plurality of the first bonding surface BS1 may be significantly less than the width W1 and the W2 of the first air gap AG1 and the second air gap AG2, respectively, and less than the length L2 of the second bonding surface BS2, the width W1 and the width W2 of the first air gap AG1 and the second air gap AG2 may be determined in the distance D without considering the length L1 of each of the plurality of the first bonding surfaces BS1. For example, the length L1 of the first bonding surface BS1 may be variously modified in consideration of a size of the first pads 152 or the second pads 232, a process margin, or the like, and embodiments of the present disclosure are not limited to the above-described numerical values.

As illustrated in FIG. 1C, the air gap AG surrounding the bonding pad structure BP may be formed by the first recess 151R and the second recess 231R. For example, the first insulating layer 151 may have the first recess 151R spaced apart from one of the first pads 152 in the first direction (the X-axis or Y-axis direction), and the second insulating layer 231 may have the second recess 231R spaced apart from one of the second pads 232 in the first direction (the X-axis or Y-axis direction) and overlapping the first recess 151R in the second direction (the Z-axis direction) to provide one air gap AG together with the first recess 151R.

The first bonding surface BS1 may be formed on one side of the air gap AG adjacent to one of the first pads 152 and one of the second pads 232, and the second bonding surface BS2 may be formed on the other side of the air gap AG, opposing the one side. For example, the first insulating layer 151 and the second insulating layer 231 may be joined between the bonding pad structure BP and the air gap AG to form the first bonding surface BS1, and may be joined on an outside of the air gap AG to form the second bonding surface BS2.

Shapes of the first recess 151R, the second recess 231R, and the air gap AG are not particularly limited, and may have various shapes according to a manufacturing process. For example, the first recess 151R may include a curved surface recessed from a first upper surface of the first insulating layer 151, facing the second semiconductor chip 200, toward a first lower surface, opposing the first upper surface. The second recess 231R may include a curved surface recessed from a second lower surface of the second insulating layer 231, facing the first semiconductor chip 100, toward a second upper surface, opposing the second lower surface.

The first recess 151R and the second recess 231R (or the air gap AG) may have a predetermined separation distance d from one of the first pads 152 or one of the second pads 232. As described with reference to FIG. 1B, the separation distance d may be for securing joining reliability between the first pads 152 and the second pads 232, and may be thus formed in various ranges according to sizes of the first pads 152 and the second pads 232. For example, the separation distance d may be from about 0.1 nm to about 500 nm, from about 0.1 nm to about 400 nm, from about 0.1 nm to about 300 nm, from about 0.1 nm to about 200 nm, from about 0.1 nm to about 100 nm, from about 1 nm to about 100 nm, about 10 nm to about 100 nm, and the like. The separation distance d can be understood to be substantially the same as the length L1 of the first bonding surface BS1 described with reference to FIG. 1B. However, depending on an embodiment, the separation distance d and the length L1 of the first bonding surface BS1 may be different (e.g., the embodiment of FIG. 2).

The first recess 151R and the second recess 231R may be formed to surround one of the first pads 152 and one of the second pads 232 on a plane (e.g., an X-Y plane), respectively.

For example, as illustrated in FIG. 1D, the air gap AG (or the first recess 151R and the second recess 231R) may be formed to surround at least a portion or all of the bonding pad structure BP (or one of the first pads 152 and one of the second pads 232) in a plan view. In addition, the first bonding surface BS1 may be formed to have a predetermined width w and at least portion or all of the bonding pad structure BP (or one of the first pads 152 and one of the second pads 232) in the plan view. In this case, it can be understood that the width w of the first bonding surface BS1 is similar to the separation distance d of FIG. 1C. According to an embodiment, the width w of the first bonding surface BS1 may not be constant, in a different manner to those illustrated in FIG. 1D (refer to FIG. 1E).

For example, as illustrated in FIG. 1E, a first bonding surface BS1' may be formed to have a first width w1 and a second width w2, having different sizes. For example, the first width w1 and the second width w2 may be about 0.1 nm to about 500 nm, about 0.1 nm to about 400 nm, about 0.1 nm to about 300 nm, about 0.1 nm to about 200 nm, about 0.1 nm to about 100 nm, about 1 nm to about 100 nm, about 10 nm to about 100 nm, or the like, respectively. The first width w1 and the second width w2 are not limited to the above-described numerical ranges, and may vary depending on a size (a width, a volume, or the like) of the first pads 152 or the second pads 232.

Figure 2:
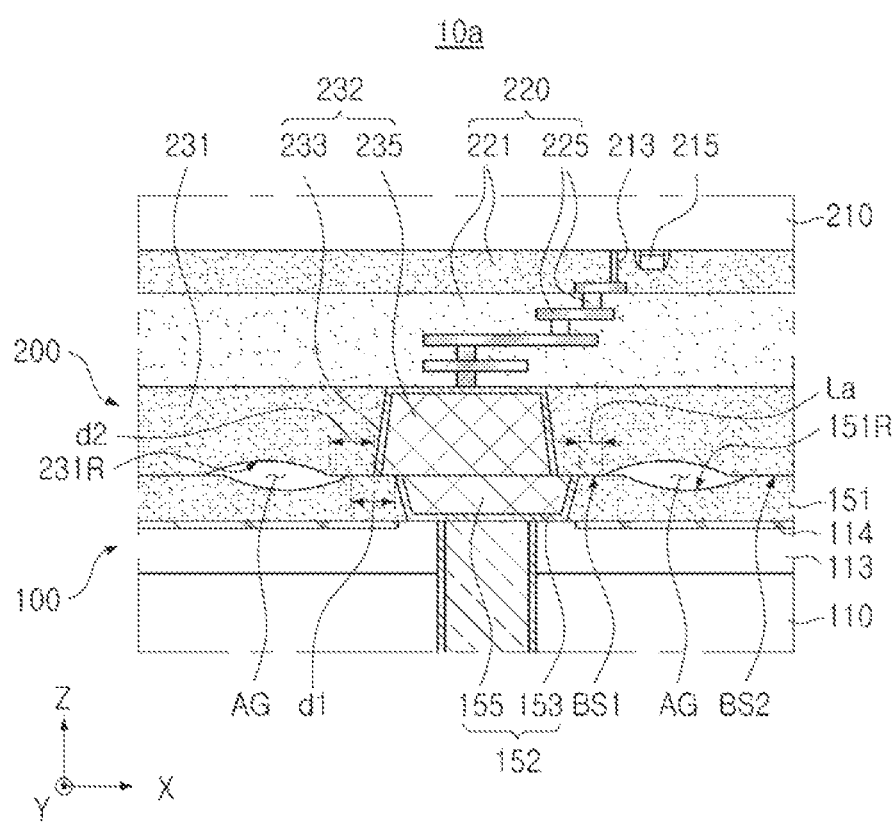
FIG. 2 is a partially enlarged view illustrating a modified example of a semiconductor package according to an embodiment of the present disclosure.

FIG. 2 is a partially enlarged view illustrating a modified example of a semiconductor package according to an embodiment of the present disclosure.

Referring to FIG. 2, in a semiconductor package 10a of the modified example, a length La of a first bonding surface BS1 may be different from a separation distance d1 of a first recess 151R and a separation distance d2 of a second recess 231R, respectively. For example, the first recess 151R and one of the first pads 152 may be spaced apart separation distance d1, the second recess 231R and one of the second pads 232 may be spaced apart by the separation distance d2, and the first bonding surface BS1 may have the length La, shorter than the separation distance d1 and the separation distance d2, respectively. The length La of the first bonding surface BS1 may refer to a length of a junction interface between the first insulating layer 151 and the second insulating layer 231, falling within the separation distance d1 and the separation distance d2, respectively. For example, a difference between the length La of the first bonding surface BS1 and each of the separation distance d1 and the separation distance d2 of the first recess 151R and the second recess 231R may be determined by a mismatch between one of the first pads 152 and one of the second pads 232. The present modified example is not limited to the mismatch illustrated in the drawings. For example, the present modified example may appear even when there is a difference in size between the first pads 152 and the second pads 232, for example, a width of the first pads 152 in the horizontal direction (the X-axis direction) is wider than a width of the second pads 232 in the horizontal direction (the X-axis direction).

Figure 3:
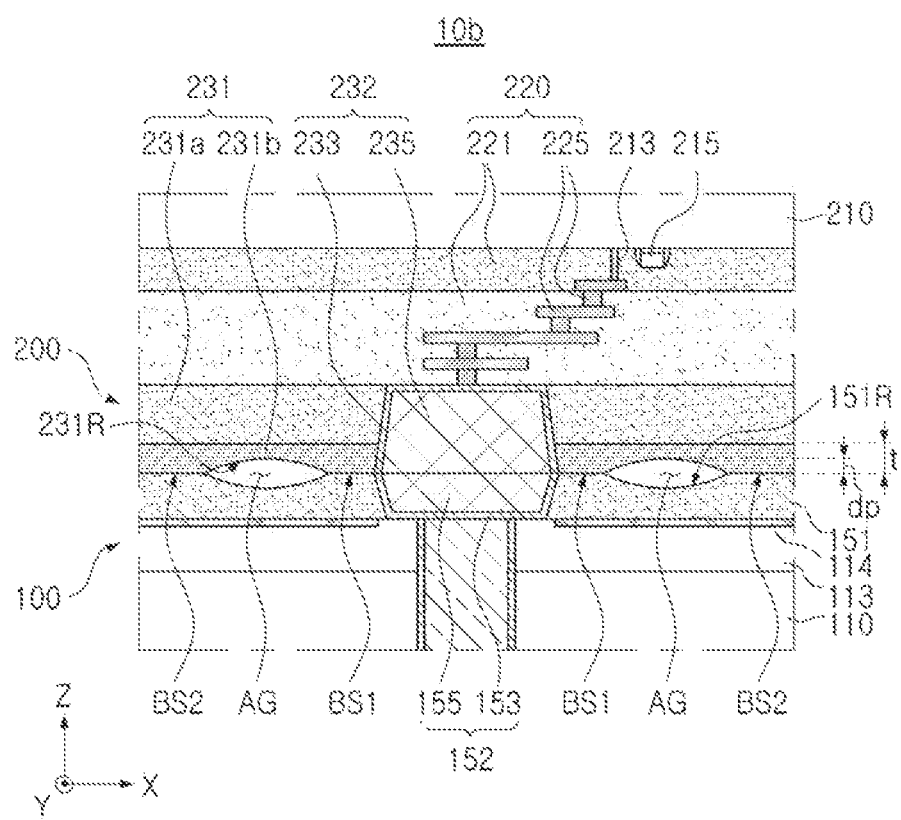
FIG. 3 is a partially enlarged view illustrating a modified example of a semiconductor package according to an embodiment of the present disclosure.

FIG. 3 is a partially enlarged view illustrating a modified example of a semiconductor package according to an embodiment of the present disclosure.

Referring to FIG. 3, a semiconductor package 10b of the modified example may have a heterogeneous junction structure in which different materials are joined on a junction interface between a first insulating layer 151 and a second insulating layer 231. For example, the second insulating layer 231 may include a lower insulating layer 231b in direct contact with the first insulating layer 151, and an upper insulating layer 231a disposed on the lower insulating layer 231b. In order to improve bonding force between the first insulating layer 151 and the second insulating layer 231, the lower insulating layer 231b may include an insulating material different from that of the first insulating layer 151. For example, the first insulating layer 151 may include silicon oxide (SiO), and the lower insulating layer 231b of the second insulating layer 231 may include silicon carbonitride (SiCN). In this case, a second recess 231R may have a depth dp equal to or less than a thickness t of the lower insulating layer 231b. For example, the thickness t of the lower insulating layer 231b may be in a range of about 0.1 μm to about 2 μm.

Figure 4:
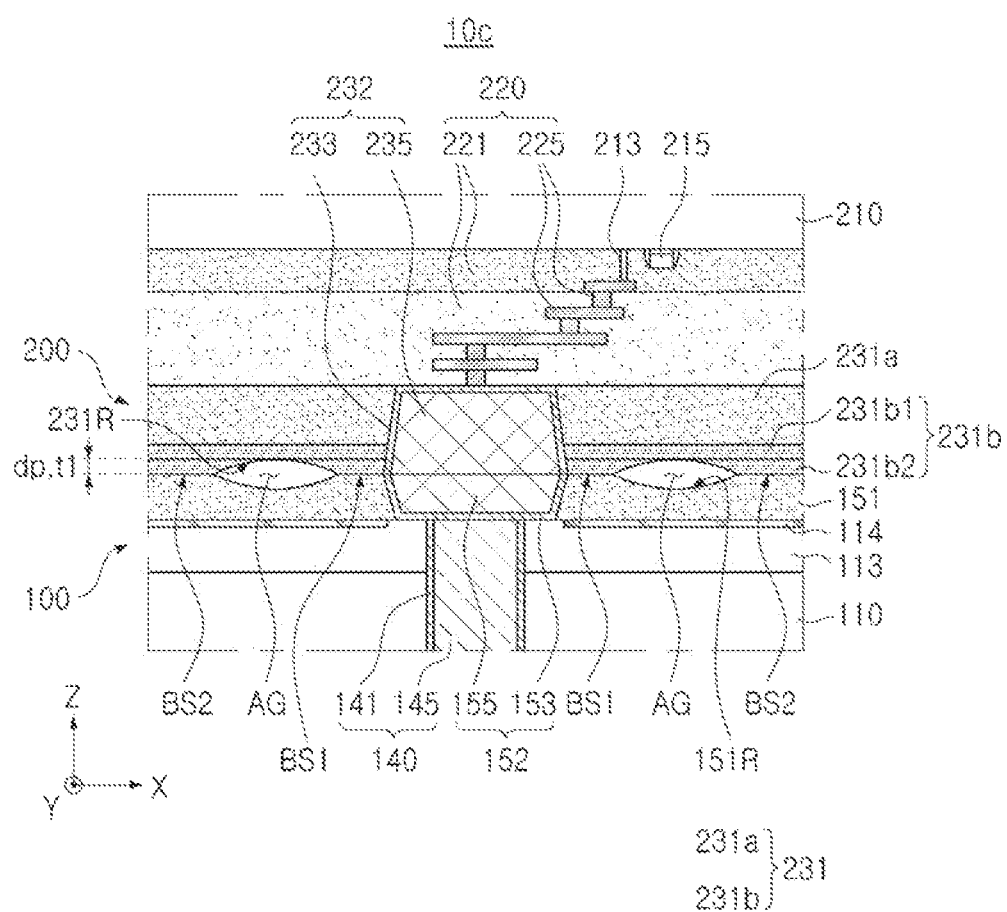
FIG. 4 is a partially enlarged view illustrating a modified example of a semiconductor package according to an embodiment of the present disclosure.

FIG. 4 is a partially enlarged view illustrating a modified example of a semiconductor package according to an embodiment of the present disclosure.

Referring to FIG. 4, a semiconductor package 10c of the modified example may include a first insulating layer 151 and/or a second insulating layer 231, including a plurality of insulating layers. For example, the second insulating layer 231 may include a lower insulating layer 231b in direct contact with the first insulating layer 151 and an upper insulating layer 231a disposed on the lower insulating layer 231b, and the lower insulating layer 231b may include a first lower insulating layer 231b1 and a second lower insulating layer 231b2. The second lower insulating layer 231b2 may include an insulating material different from that of the first insulating layer 151. For example, the first insulating layer 151 may include silicon oxide (SiO), and the second lower insulating layer 231b2 may include silicon carbonitride (SiCN). Also, the first lower insulating layer 231b1 may include the same or different material from the second lower insulating layer 231b2. For example, the first lower insulating layer 231b1 may include silicon oxide (SiO) or silicon carbonitride (SiCN). Even in the present modified example, a second recess 231R may have a depth dp equal to or smaller than a thickness t1 of the second lower insulating layer 231b2 located at the lowermost side. For example, the second recess 231R may be formed within the thickness t1 of the second lower insulating layer 231b2 forming a junction interface between the second lower insulating layer 231b2 and the first insulating layer 151, and thereby, interfacial reliability between the first lower insulating layer 231b1 and the second lower insulating layer 231b2 may be secured. The lower insulating layer 231b may include a larger number of insulating layers than those illustrated in the drawings. Also, according to a modified example, the first insulating layer 151 may also include a plurality of insulating layers.

Figure 5:
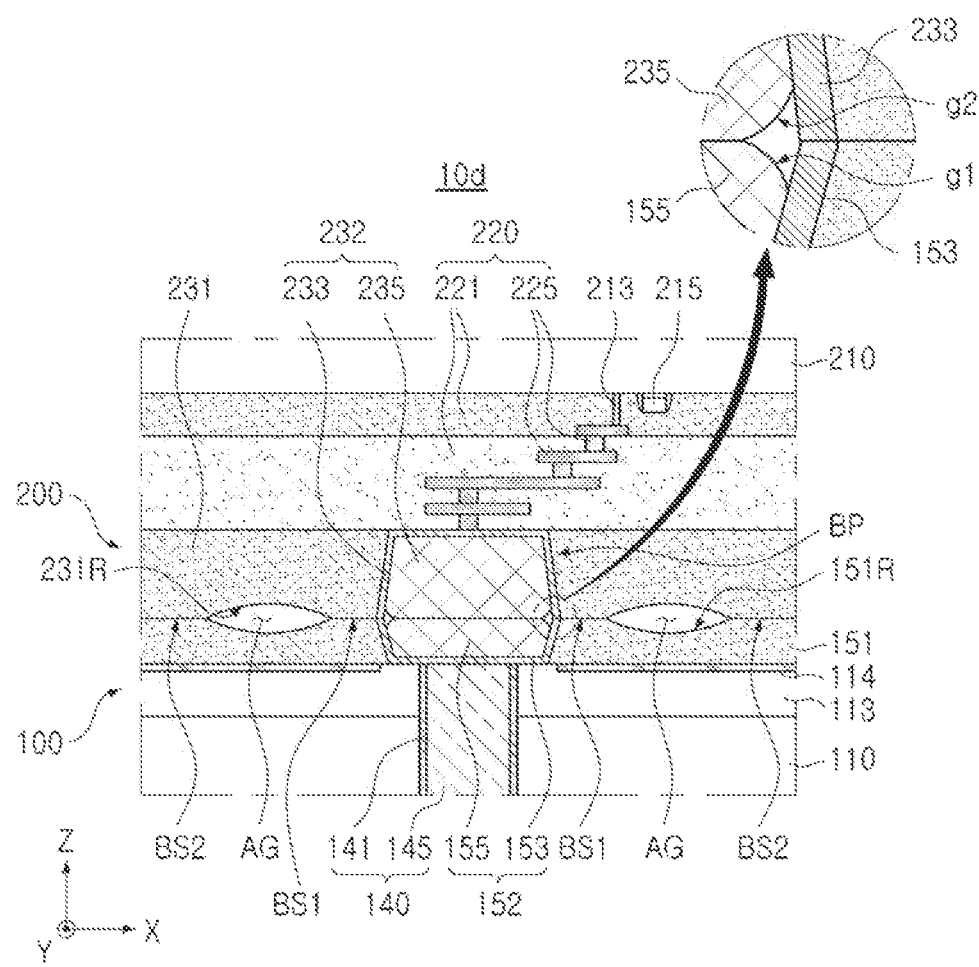
FIG. 5 is a partially enlarged view illustrating a modified example of a semiconductor package according to an embodiment of the present disclosure.

FIG. 5 is a partially enlarged view illustrating a modified example of a semiconductor package according to an embodiment of the present disclosure.

Referring to FIG. 5, a semiconductor package 10d of the modified example may include grooves (e.g., a first groove g1 and a second groove g2) formed in a bonding pad structure BP. For example, the first pads 152 may include a first conductive layer 155 and a first barrier layer 153 surrounding a side surface of the first conductive layer 155, and the second pads 232 may include a second conductive layer 235 contacting at least a portion of the first conductive layer 155, and a second barrier layer 233 surrounding a side surface of the second conductive layer 235. In this case, the first conductive layer 155 may have a first groove g1 exposing at least a portion of the first barrier layer 153, and the second conductive layer 235 may have a second groove g2 exposing at least a portion of the second barrier layer 233. For example, at least a portion of an inner wall of the first barrier layer 153 and at least a portion of an inner wall of the second barrier layer 233 may be exposed from the first conductive layer 155 and the second conductive layer 235 by the first groove g1 and the second groove g2, respectively. An outer wall of the first barrier layer 153 and an outer wall of the second barrier layer 233 may be covered by the first insulating layer 151 and the second insulating layer 231, respectively, and may not be exposed to an air gap AG. The first groove g1 and groove g2 may secure expansion spaces of the first conductive layer 155 and the second conductive layer 235, respectively, to more stably bond the first pads 152 and the second pads 232, fixed by a first bonding surface BS1, during joining and bonding of the first pads 152 and the second pads 232.

Figure 6:
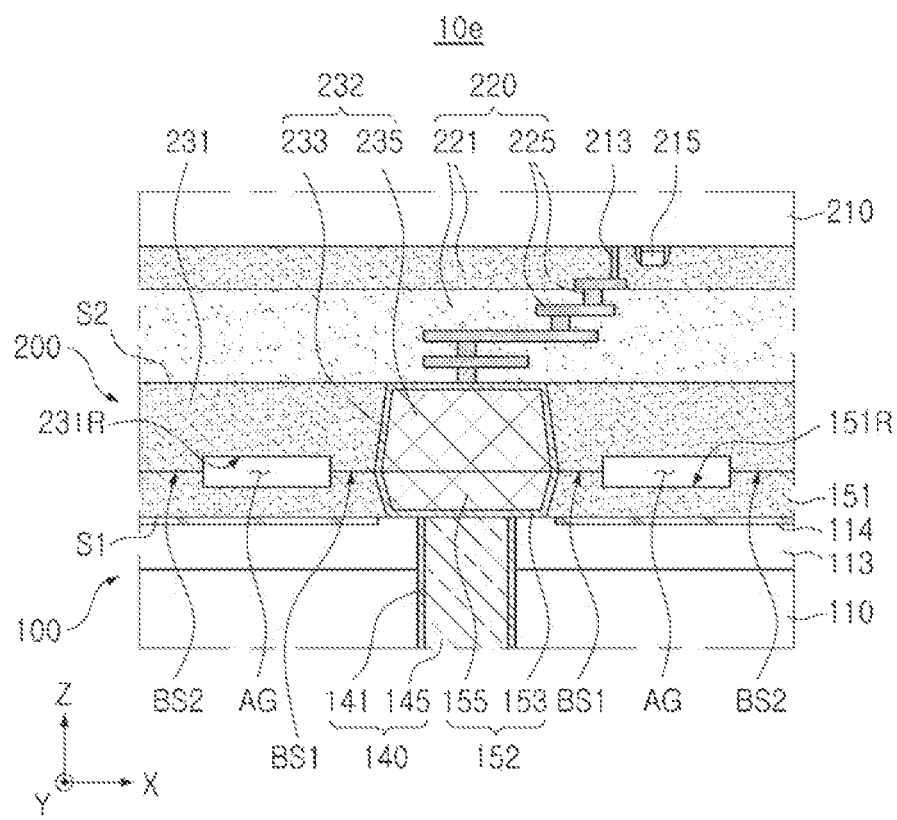
FIG. 6 is a partially enlarged view illustrating a modified example of a semiconductor package according to an embodiment of the present disclosure.

FIG. 6 is a partially enlarged view illustrating a modified example of a semiconductor package according to an embodiment of the present disclosure.

Referring to FIG. 6, a semiconductor package 10e of the modified example may include a first recess 151R and a second recess 231R, formed by a photolithography process and an etching process. For example, the first recess 151R may include a first flat surface recessed from a first upper surface of a first insulating layer 151, facing a second semiconductor chip 200, toward a first lower surface S1, opposing the first upper surface, and the second recess 231R may include a second flat surface recessed from a second lower surface of a second insulating layer 231, facing a first semiconductor chip 100, toward a second upper surface S2, opposing the second lower surface. In the present modified example, a separation distance between the first recess 151R and the second recess 231R and a length of a first bonding surface BS1 may be easily adjusted, as compared to a case in which the first recess 151R and the second recess 231R are formed using a planarization process (e.g., a chemical mechanical polishing (CMP) process).

Figure 7:
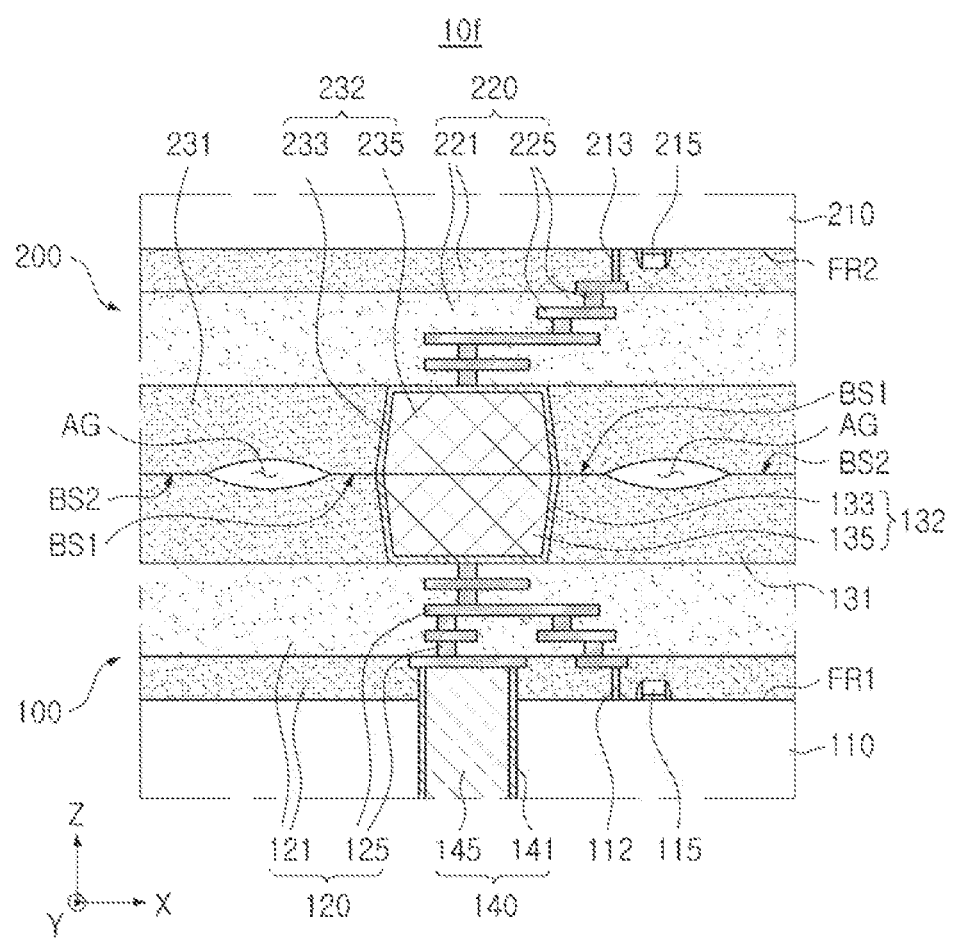
FIG. 7 is a partially enlarged view illustrating a modified example of a semiconductor package according to an embodiment of the present disclosure.

FIG. 7 is a partially enlarged view illustrating a modified example of a semiconductor package according to an embodiment of the present disclosure.

Referring to FIG. 7, in a semiconductor package 10f of the modified example, a second semiconductor chip 200 may be stacked on a first circuit layer 120 of a first semiconductor chip 100. For example, the first semiconductor chip 100 and the second semiconductor chip 200 may be arranged such that a first front surface FR1 and a second front surface FR2 oppose. The first circuit layer 120, a first front insulating layer 131, and first pads 132 (also referred to as 'first front pads') may be disposed on the first front surface FR1 of the first semiconductor chip 100, and a second circuit layer 220, a second insulating layer 231 (also referred to as a 'second front insulating layer'), and second pads 232 (also referred to as 'second front pads') may be disposed on the second front surface FR2 of the second semiconductor chip 200. The first circuit layer 120 may include a first wiring structure 125 electrically connected to individual devices 115 through an interconnection portion 112, and a first interlayer insulating layer 121 surrounding the first wiring structure 125. Since the first circuit layer 120 has substantially the same characteristics as the second circuit layer 220, described above, overlapping description thereof will be omitted.

In the present modified example, the first front insulating layer 131 may have a first recess 131R providing an air gap AG together with a second recess 231R. The first recess 131R may be spaced apart from one of the first pads 132 by a predetermined distance, and a first bonding surface BS1 may be formed between the first recess 131R and one of the first pads 132. In this case, it can be understood that a first insulating layer 151 (or a first upper insulating layer) and one of the first pads 152 are arranged opposing the first front insulating layer 131 and the one of the first pads 132, respectively, and the first insulating layer 151 does not include a recess. Also, it can be understood that the second insulating layer 231 and the second pads 232 may also be referred to as a 'second lower insulating layer' and 'second lower pads' (or 'second front pads'), respectively. For example, the present modified example may have the same or similar characteristics as those described with reference to FIGS. 1A to 6, except that the first semiconductor chip 100 of FIG. 1A is vertically inverted and joined to the second semiconductor chip 200.

Figure 8:
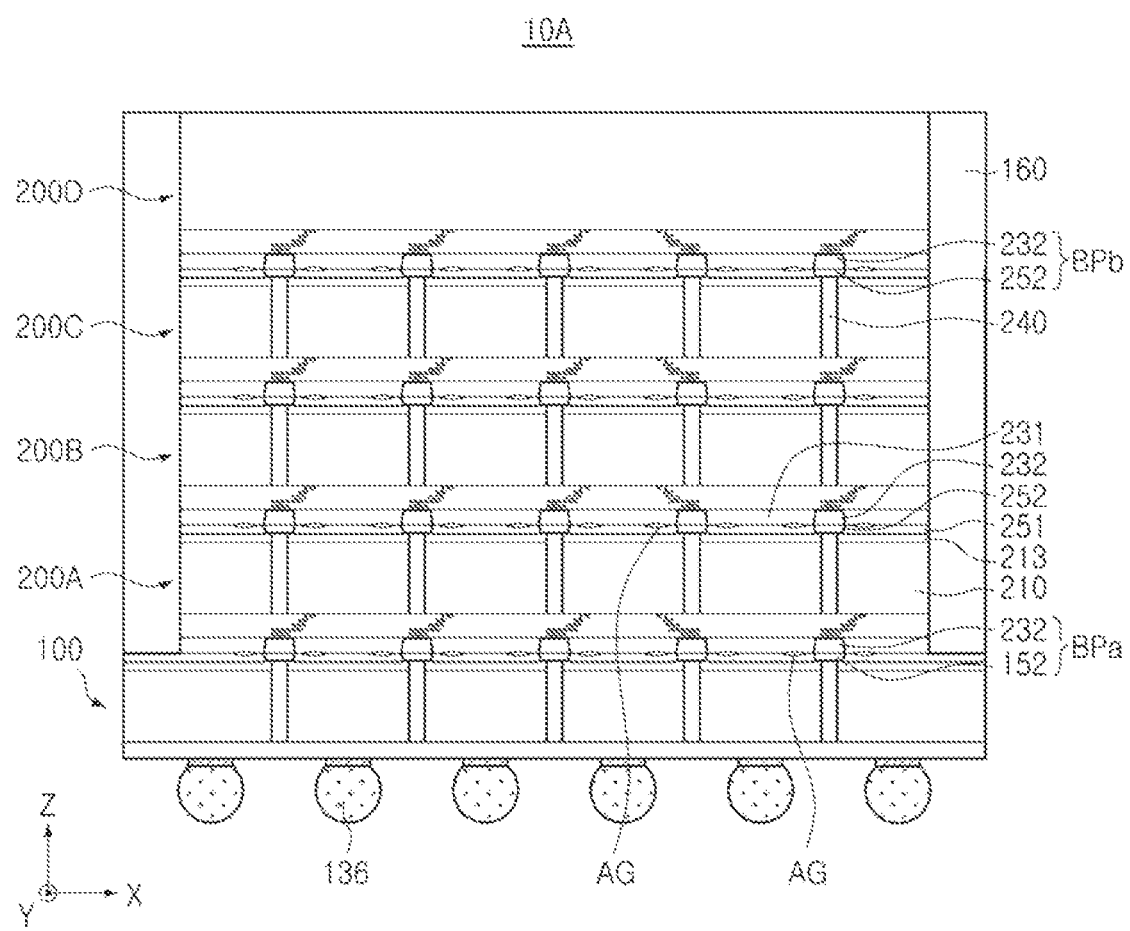
FIG. 8 is a cross-sectional view illustrating a semiconductor package according to an embodiment of the present disclosure.

FIG. 8 is a cross-sectional view illustrating a semiconductor package 10A according to an embodiment of the present disclosure.

Referring to FIG. 8, since a semiconductor package 10A according to an embodiment has the same or similar characteristics as those described with reference to FIGS. 1A to 7, except that a plurality of second semiconductor chips 200A, 200B, 200C, and 200D stacked on a first semiconductor chip 100 in a vertical direction (the Z-axis direction), and a molding member 160 are included, overlapping descriptions thereof will be omitted.

Junction interfaces in which a second rear insulating layer 251 and a second insulating layer 231 (also referred to as a 'second front insulating layer') are joined and second rear pads 252 and second pads 232 (also referred to as 'second front pads') are joined may be formed between the plurality of second semiconductor chips 200A, 200B, 200C, and 200D. The plurality of second semiconductor chips 200A, 200B, 200C, and 200D may be electrically connected to each other by an upper bonding pad structure BPb to which one of the second rear pads 252 and one of the second pads 232 are joined and bonded. Among the plurality of second semiconductor chips 200A, 200B, 200C, and 200D, a lowermost second semiconductor chip 200A may be electrically connected to the first semiconductor chip 100 by a lower bonding pad structure BPa to which one of the second pads 232 and one of first pads 152 (also referred to as 'first rear pads') of the first semiconductor chip 100 are joined and bonded. In addition, a plurality of the air gap AG may be formed to surround the lower bonding pad structure BPa and the upper bonding pad structure BPb. The plurality of the air gap AG may be formed to be spaced apart from the lower bonding pad structure BPa or the upper bonding pad structure BPb by a predetermined distance.

The plurality of second semiconductor chips 200A, 200B, 200C, and 200D may have the same or similar structure as the second semiconductor chip 200 described with reference to FIGS. 1A to 7, except that a second through-electrode 240 for forming a mutual electrical connection path is further included. An uppermost second semiconductor chip 200D may not include the second through-electrode 240, and may have a relatively large thickness. According to an embodiment, a larger or smaller number of semiconductor chips, as compared to those illustrated in the drawings, may be stacked on the first semiconductor chip 100. For example, three or less or five or more semiconductor chips may be stacked on the first semiconductor chip 100.

For example, the first semiconductor chip 100 may be a buffer chip or a control chip including a plurality of logic devices and/or a plurality of memory devices. The first semiconductor chip 100 may transmit a signal from the plurality of second semiconductor chips 200A, 200B, 200C, and 200D, stacked thereon, externally, and may also transmit a signal and power from the outside to the plurality of second semiconductor chips 200A, 200B, 200C, and 200D. The plurality of second semiconductor chips 200A, 200B, 200C, and 200D may be memory chips including a volatile memory device such as a DRAM or an SRAM, or a nonvolatile memory device such as a PRAM, an MRAM, an FeRAM, or an RRAM. In this case, the semiconductor package 10A of the present embodiment may be used for a high bandwidth memory (HBM) product, an electro data processing (EDP) product, or the like.

The molding member 160 may be disposed on the first semiconductor chip 100, and may seal at least a portion of each of the plurality of second semiconductor chips 200A, 200B, 200C, and 200D. The molding member 160 may be formed to expose an upper surface of the uppermost second semiconductor chip 200D. According to embodiments, the molding member 160 may be formed to cover the upper surface of the uppermost second semiconductor chip 200D. The molding member 160 may include, for example, an epoxy mold compound (EMC), but a material of the molding member 160 is not particularly limited.

Figure 9A:
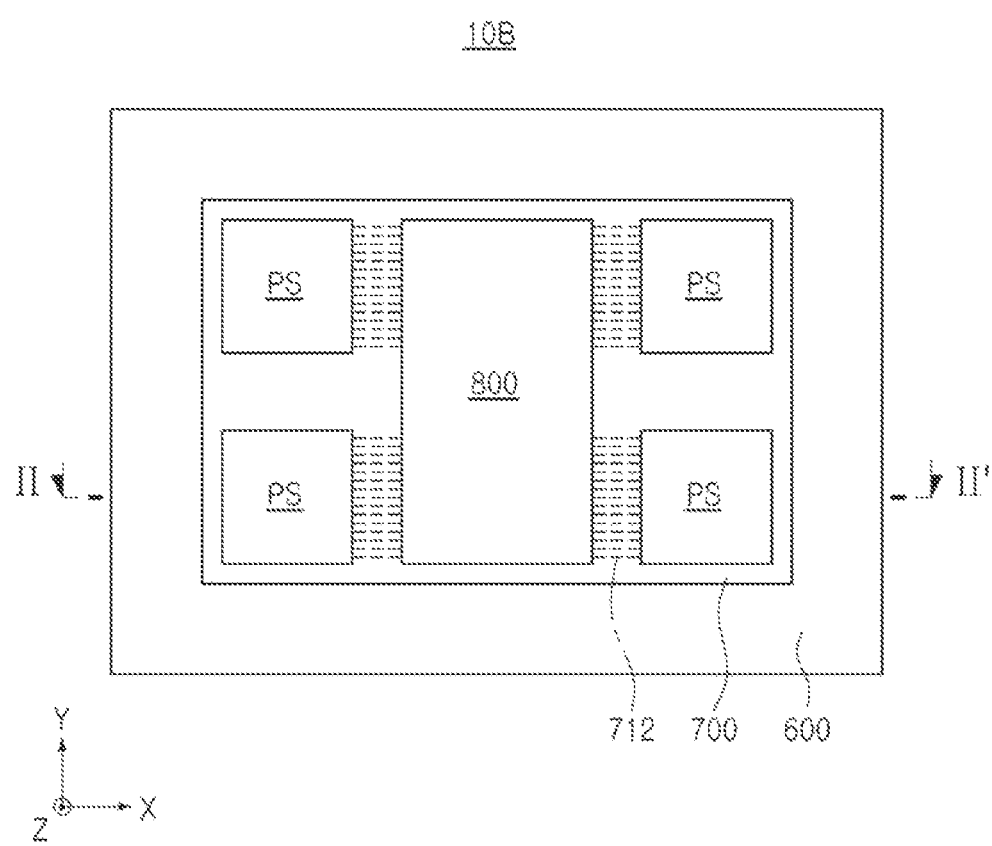
FIG. 9A is a plan view illustrating a semiconductor package according to an embodiment of the present disclosure.
Figure 9B:
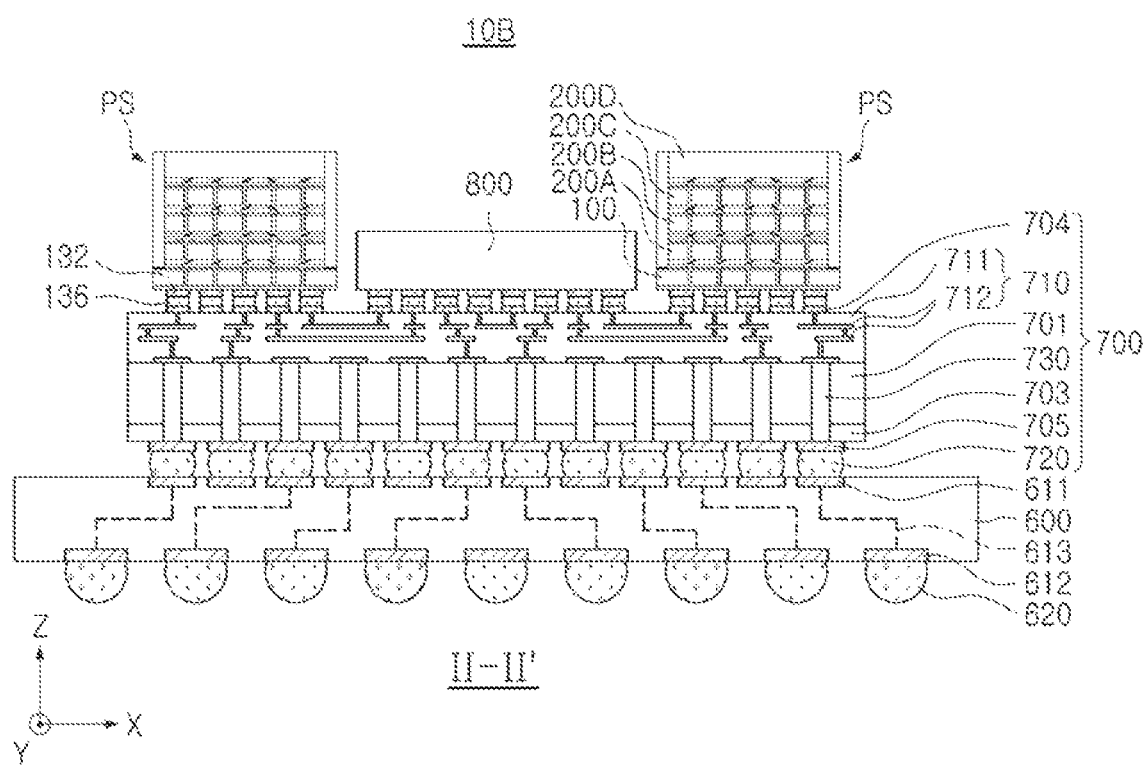
FIG. 9B is a cross-sectional view of FIG. 9A, taken along line II-II'.

FIG. 9A is a plan view illustrating a semiconductor package 10B according to an embodiment of the present disclosure, and FIG. 9B is a cross-sectional view of FIG. 9A, taken along line II-II'.

Referring to FIGS. 9A and 9B, a semiconductor package 10B according to an embodiment may include a package substrate 600, an interposer substrate 700, and at least one package structure PS. In addition, the semiconductor package 10B may further include a processor chip 800 (or a logic chip) disposed adjacent to the package structure PS on the interposer substrate 700. The package structure PS is illustrated in the form of the semiconductor package 10A illustrated in FIG. 8, but is not limited thereto, and may have the same or similar characteristics as the semiconductor package 10, the semiconductor package 10a, the semiconductor package 10b, the semiconductor package 10c, the semiconductor package 10d, the semiconductor package 10e, and the semiconductor package 10f.

The package substrate 600 may be a support substrate on which the interposer substrate 700, the processor chip 800, and the package structure PS are mounted, and may be a substrate for a semiconductor package including a printed circuit board (PCB), a ceramic substrate, a glass substrate, a tape wiring substrate, or the like. The package substrate 600 may include a lower pad 612 disposed on a lower surface of a body, an upper pad 611 disposed on an upper surface of the body, and a wiring circuit 613 electrically connecting the lower pad 612 and the upper pad 611. The body of the package substrate 600 may include a different material, depending on a type of the substrate. For example, when the package substrate 600 is a printed circuit board, the package substrate 600 may have a form in which a wiring layer is additionally stacked on one surface or both surfaces of a body copper clad laminate or a copper clad laminate. The lower pad 612, the upper pad 611, and the wiring circuit 613 may form an electrical path connecting the lower surface and the upper surface of the package substrate 600. An external connection bump 620 connected to the lower pad 612 may be disposed on the lower surface of the package substrate 600. The external connection bump 620 may include, for example, a solder ball.

The interposer substrate 700 may include a substrate 701, a lower protective layer 703, a lower pad 705, an interconnection structure 710, a conductive bump 720, and a through-via 730. The package structure PS and the processor chip 800 may be stacked on the package substrate 600 via the interposer substrate 700. The interposer substrate 700 may electrically connect the package structure PS and the processor chip 800 to each other.

The substrate 701 may be formed of, for example, any one of a silicon substrate, an organic material substrate, a plastic substrate, and a glass substrate. When the substrate 701 is a silicon substrate, the interposer substrate 700 may be referred to as a silicon interposer. When the substrate 701 is an organic material substrate, the interposer substrate 700 may be referred to as a panel interposer.

The lower protective layer 703 may be disposed on a lower surface of the substrate 701, and the lower pad 705 may be disposed on a lower surface of the lower protective layer 703. The lower pad 705 may be connected to the through-via 730. The package structure PS and the processor chip 800 may be electrically connected to the package substrate 600 through the conductive bump 720 disposed on the lower pad 705.

The interconnection structure 710 may be disposed on an upper surface of the substrate 701, and may include an interlayer insulating layer 711 and a wiring structure 712, which may be provided as a single-layer wiring structure or a multi-layered wiring structure. When the interconnection structure 710 has a multi-layered wiring structure, wiring patterns of different layers may be connected to each other through a contact via. An upper pad 704 connected to the wiring structure 712 may be disposed on the interconnection structure 710. The package structure PS and the processor chip 800 may be connected to the upper pad 704 through the connection bump 136.

The through-via 730 may extend from the upper surface to the lower surface of the substrate 701 to penetrate the substrate 701. For example, the through-via 730 may extend into the interconnection structure 710 to be electrically connected to wirings of the interconnection structure 710. When the substrate 701 is formed of silicon, the through-via 730 may be referred to as a through-silicon via (TSV). According to an embodiment, the interposer substrate 700 may include only an interconnection structure therein, but may not include a through-via.

The interposer substrate 700 may be used for the purpose of converting or transferring an input electrical signal between the package substrate 600 and the package structure PS or the processor chip 800. Therefore, the interposer substrate 700 may not include an element such as an active element, a passive element, or the like. According to an embodiment, the interconnection structure 710 may be disposed below the substrate 701.

The conductive bump 720 may be disposed on a lower surface of the interposer substrate 700, and may be electrically connected to the interconnection structure 710. The interposer substrate 700 may be mounted on the package substrate 600 through the conductive bump 720. For example, some of a plurality of the lower pad 705 used for power or ground, among a plurality of the lower pad 705, may be integrated, and may be connected to the conductive bump 720, such that the number of the lower pad 705 is larger than the number of the conductive bump 720.

The processor chip 800 (or logic chip) may include, for example, a central processing unit (CPU), a graphics processing unit (GPU), a field programmable gate array (FPGA), a digital signal processor (DSP), a cryptographic processor, a microprocessor, a microcontroller, an analog-to-digital converter, an application specific integrated circuit (ASIC), or the like. Depending on types of integrated circuits included in the processor chip 800, the semiconductor package 10B may be referred to as a server-oriented semiconductor package or a mobile-oriented semiconductor package. According to an embodiment, the processor chip 800 and/or the package structure PS mounted on the interposer substrate 700 may be provided in more or less numbers than those illustrated in the drawings.

Figure 10A:
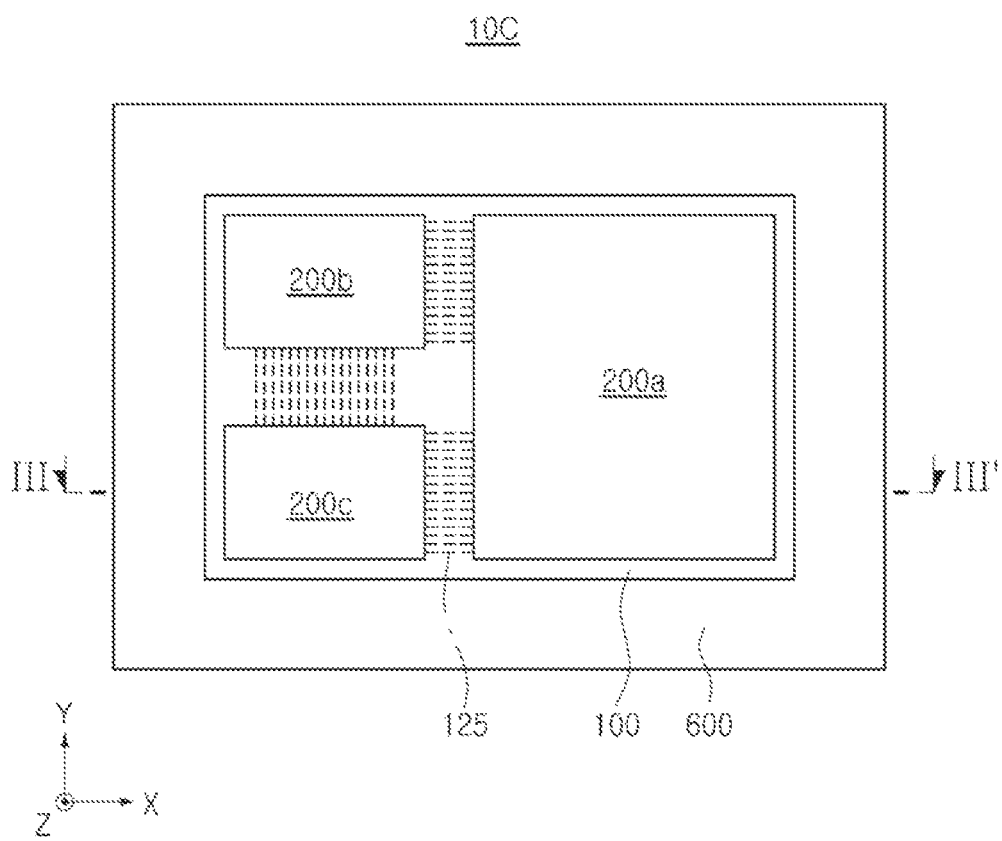
FIG. 10A is a plan view illustrating a semiconductor package according to an embodiment of the present disclosure.
Figure 10B:
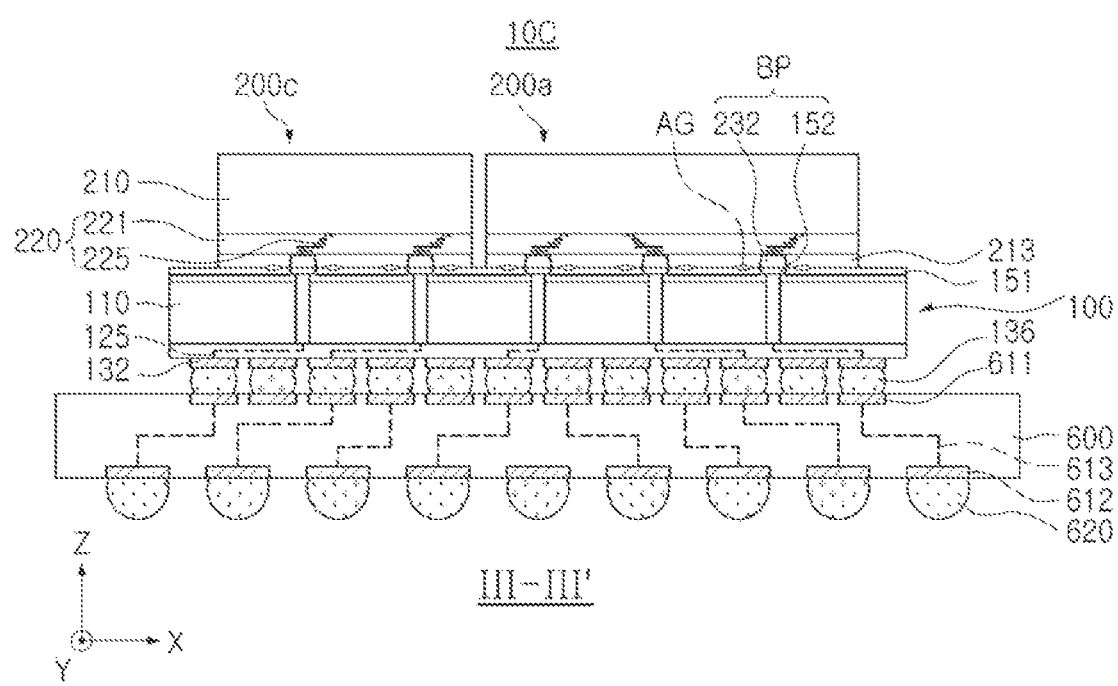
FIG. 10B is a cross-sectional view of FIG. 10A, taken along line III-III'.

FIG. 10A is a plan view illustrating a semiconductor package 10C according to an embodiment of the present disclosure, and FIG. 10B is a cross-sectional view of FIG. 10A, taken along line III-III'.

Referring to FIGS. 10A and 10B, a semiconductor package 10C according to an embodiment may include a plurality of second semiconductor chips 200a, 200b, and 200c, horizontally disposed on a first semiconductor chip 100. In the present embodiment, the plurality of second semiconductor chips 200a, 200b, and 200c (also referred to as 'chiplets') may include chiplets constituting a multi-chip module (MCM). For example, the second semiconductor chips 200a, 200b, and 200c may be mounted on the first semiconductor chip 100. According to an embodiment, the second semiconductor chips 200a, 200b, and 200c may be electrically connected to each other through a first wiring structure 125 (e.g., a wiring circuit) of the first semiconductor chip 100. A bonding pad structure BP and a plurality of an air gap AG, as described with reference to FIGS. 1A to 7, may be formed between the first semiconductor chip 100 and the second semiconductor chips 200a, 200b, and 200c. The plurality of the air gap AG may be spaced apart from the bonding pad structure BP by a predetermined distance, to improve junction quality between first pads 152 and second pads 232.

The first semiconductor chip 100 may include an active interposer that functions as an I/O chip. For example, the first semiconductor chip 100 may include an I/O device, a DC/DC converter, a sensor, a test circuit, or the like therein. Since the first semiconductor chip 100 may include elements similar to those of the interposer substrate 700 illustrated in FIG. 9B, overlapping descriptions thereof will be omitted. In the drawings, the first semiconductor chip 100 is illustrated in the form of a silicon interposer substrate, but a substrate applicable to the present embodiment is not limited thereto. The first semiconductor chip 100 may be mounted on a package substrate 600.

The second semiconductor chips 200a, 200b, and 200c may include a CPU, a GPU, an FPGA, or the like. The second semiconductor chips 200a, 200b, and 200c may be formed of different chips. For example, the second semiconductor chip 200a may be a GPU chip, the second semiconductor chip 200b may be a CPU chip, and the second semiconductor chip 200c may be an FPGA chip. According to an embodiment, the second semiconductor chips 200a, 200b, and 200c may be formed of the same type of chips. For example, all of second semiconductor chips 200a, 200b, and 200c may include GPU chips. The number of chiplets disposed on the first semiconductor chip 100 is not particularly limited, and for example, two or less or four or more chiplets may be mounted on the first semiconductor chip 100. In this case, the chiplet or the chiplet technology may refer to a semiconductor chip manufactured separately according to a size and a function of a device, or a manufacturing technology for such a semiconductor chip.

FIGS. 11A to 11H are cross-sectional views illustrating a manufacturing process for forming a recess on a rear surface of a semiconductor chip. FIGS. 11A to 11H illustrate a portion of a manufacturing process of the first semiconductor chip 100 illustrated in FIG. 1A, according to a process sequence.

Figure 11A:
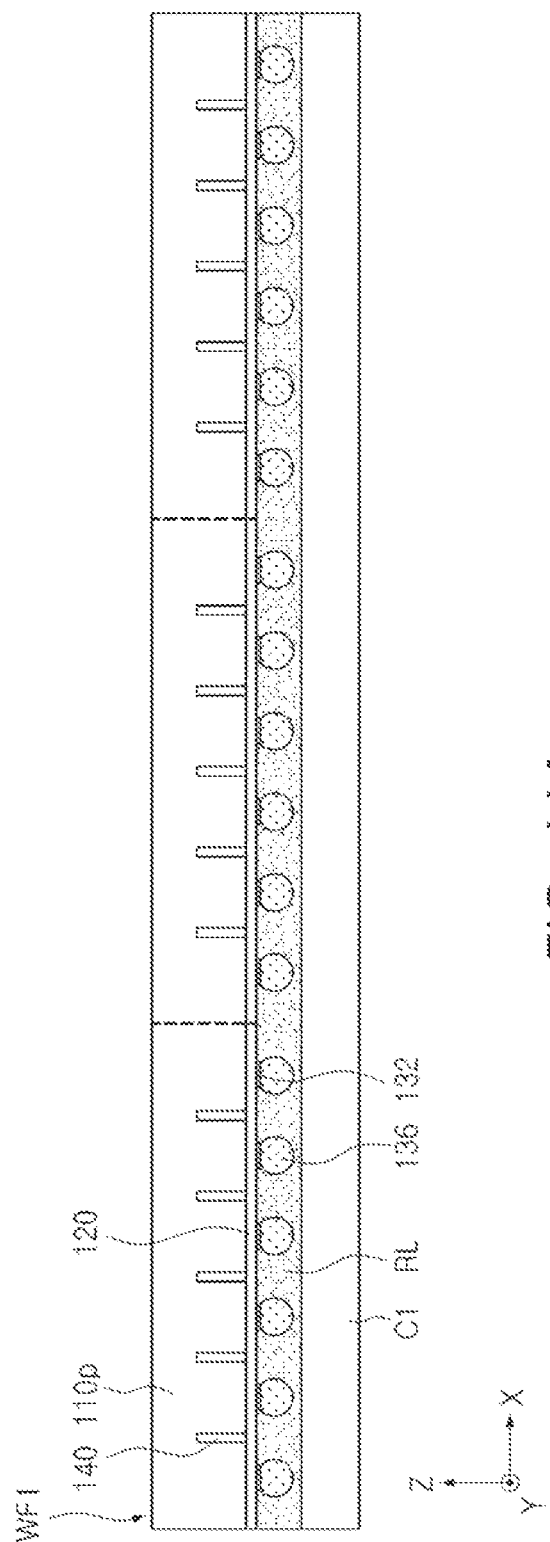
FIG. 11A is a first cross-sectional view illustrating a manufacturing process for forming a recess on a rear surface of a semiconductor chip.

Referring to FIG. 11A, a first semiconductor wafer WF1 including a first preliminary substrate 110p and a plurality of first through-electrodes 140 arranged in the first preliminary substrate 110p, may be prepared.

The first semiconductor wafer WF1 may be temporarily supported on a first carrier substrate C1 by a junction material layer RL such as glue. The first semiconductor wafer WF1 may include components for a plurality of semiconductor chips (or 'first semiconductor chips'). Specifically, a first circuit layer 120 formed on an active surface of the first preliminary substrate 110p, and a plurality of first through-electrodes 140 connected to a wiring structure of the first circuit layer 120 may be included. The plurality of first through-electrodes 140 may be formed before or during formation of the first circuit layer 120, but may be formed not to completely penetrate the first preliminary substrate 110p. Also, a connection bump 136 buried in the junction material layer RL may be disposed below the first semiconductor wafer WF1.

Figure 11B:
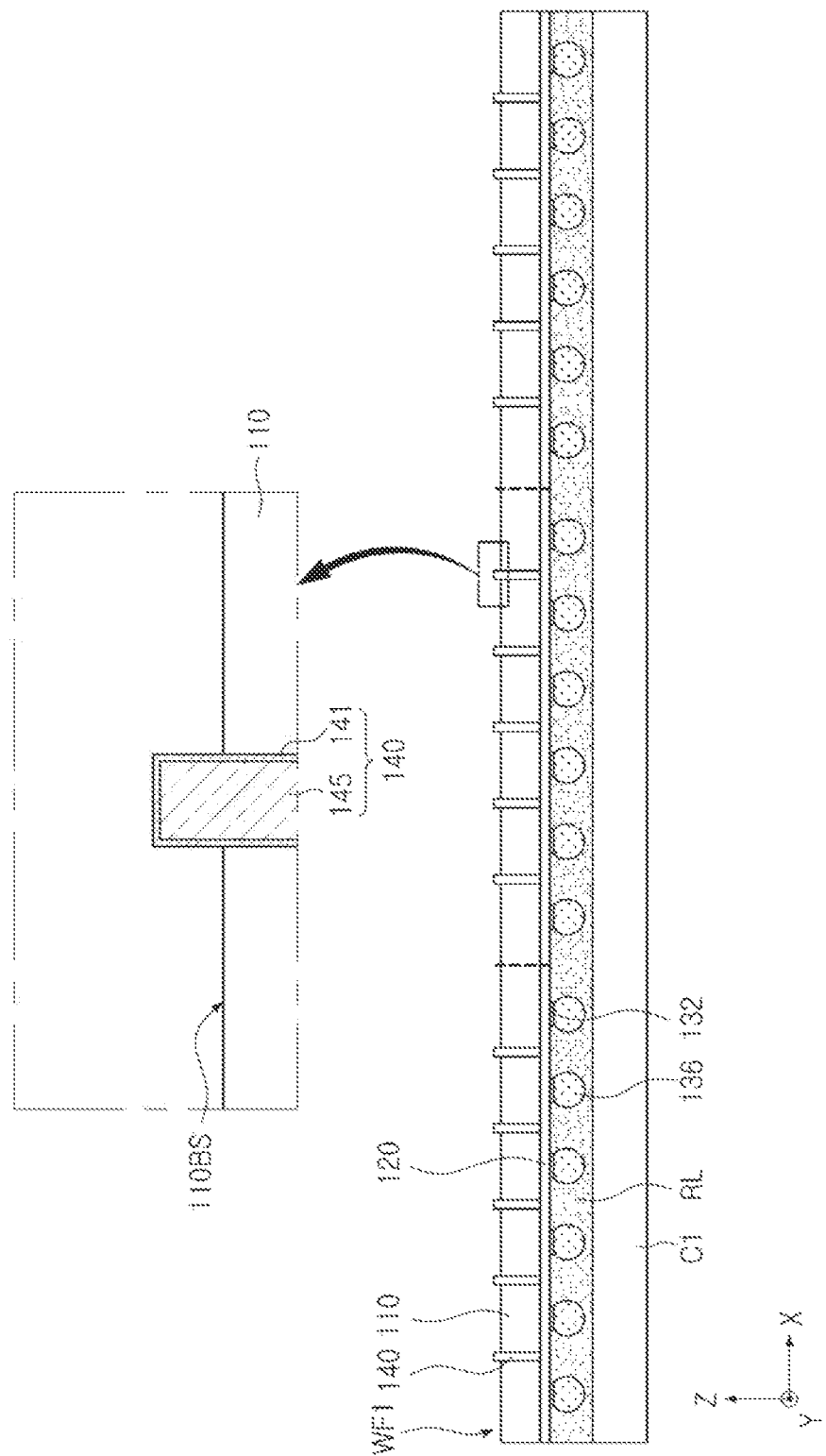
FIG. 11B is a second cross-sectional view illustrating the manufacturing process for forming the recess on the rear surface of the semiconductor chip.

Referring to FIG. 11B, a portion of the first preliminary substrate 110p may be removed to form a first substrate 110 having a rear surface 110BS from which the plurality of first through-electrodes 140 protrude.

The first substrate 110 having a desired thickness may be formed by applying a polishing process to an upper surface (an inactive surface) of the first preliminary substrate 110p. The polishing process may be performed by a grinding process such as a CMP process, an etch-back process, or a combination thereof. For example, the grinding process may be performed to reduce the first preliminary substrate 110p to a predetermined thickness, and the etch-back process having an appropriate condition may be applied to sufficiently expose the first through-electrodes 140.

Figure 11C:
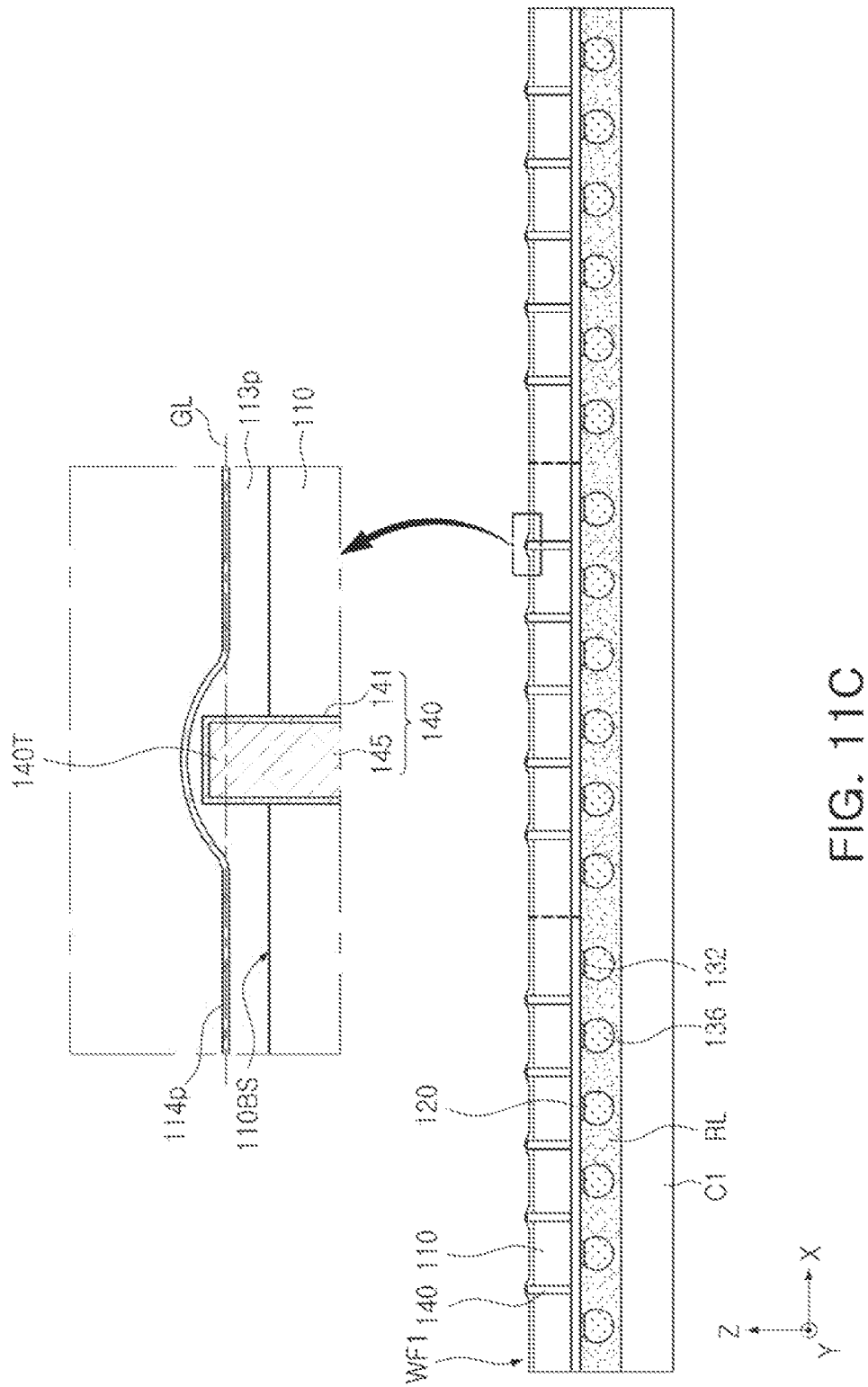
FIG. 11C is a third cross-sectional view illustrating the manufacturing process for forming the recess on the rear surface of the semiconductor chip.

Referring to FIG. 11C, a preliminary protective layer 113p and a preliminary buffer layer 114p, covering upper ends 140T of the plurality of first through-electrodes 140 protruding on the rear surface 110BS of the first substrate 110 may be formed. The preliminary protective layer 113p may be formed of silicon oxide, and the preliminary buffer layer 114p may be formed of silicon nitride or silicon oxynitride. The preliminary protective layer 113p and the preliminary buffer layer 114p may be formed using a PVD process or a CVD process. Subsequently, the preliminary protective layer 113p and the preliminary buffer layer 114p may be planarized (e.g., grinded) to expose the first through-electrodes 140. By the planarization process, the preliminary protective layer 113p and the preliminary buffer layer 114p may be removed to reach a predetermined line GL. In addition, a portion of the upper ends 140T of the first through-electrodes 140 may also be removed.

Figure 11D:
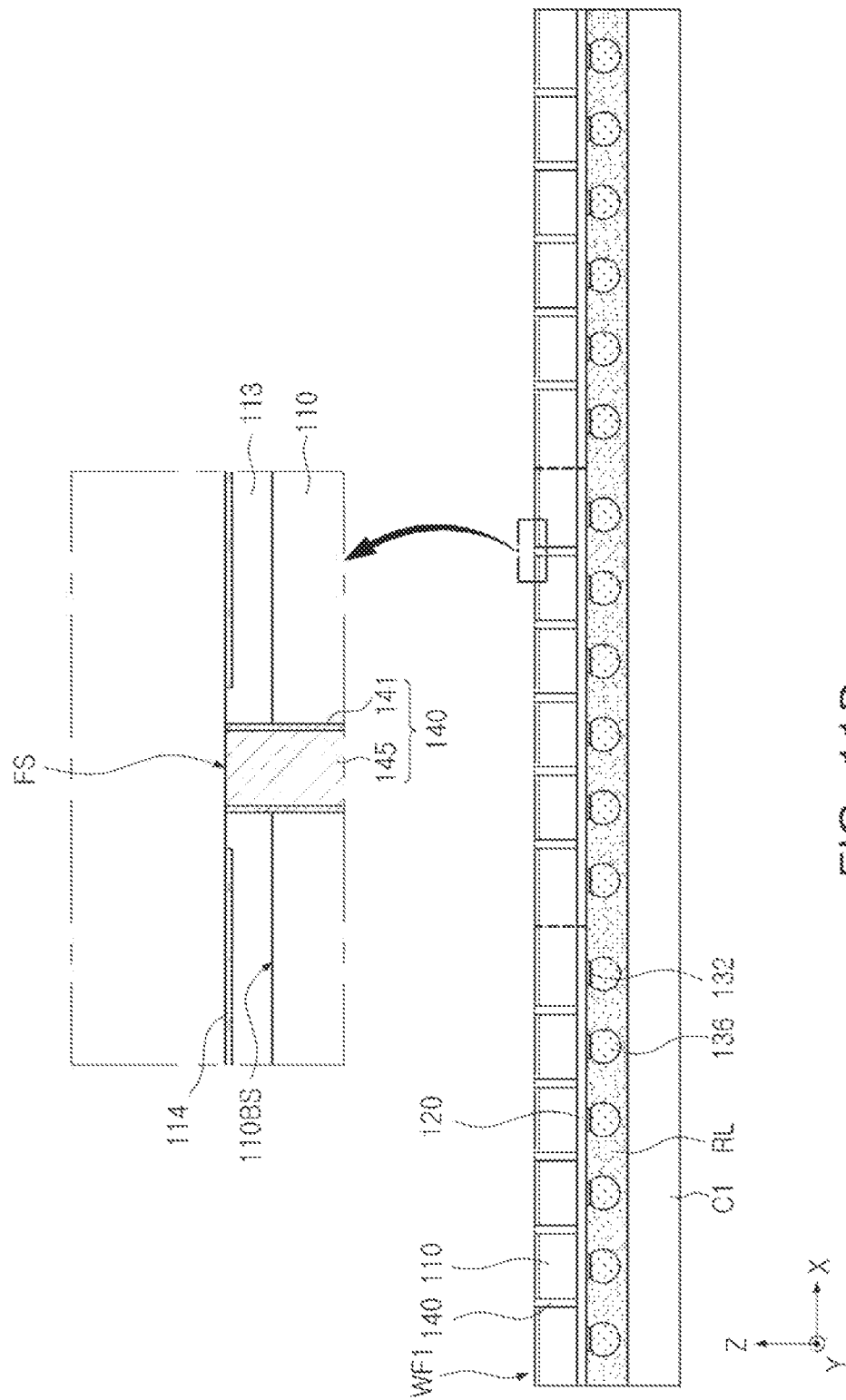
FIG. 11D is a fourth cross-sectional view illustrating the manufacturing process for forming the recess on the rear surface of the semiconductor chip.

Referring to FIG. 11D, the first semiconductor wafer WF1 may have a flat surface FS from which a protective layer 113, a buffer layer 114, and the plurality of first through-electrodes 140 are exposed. As described above, since the upper ends 140T of the first through-electrodes 140 may be partially removed by the planarization process, a portion of a via plug 145 may be exposed through the flat surface FS.

Figure 11E:
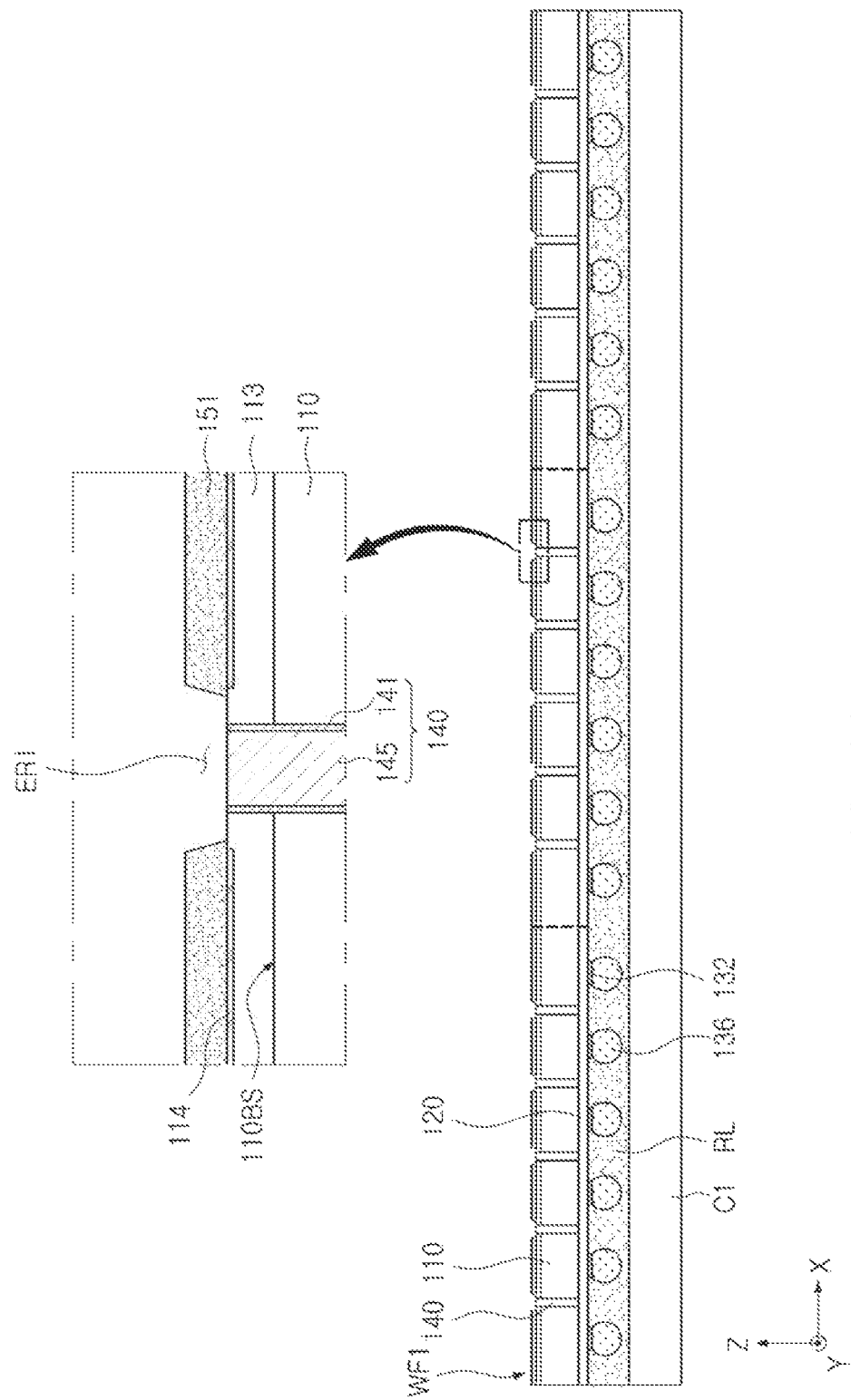
FIG. 11E is a fifth cross-sectional view illustrating the manufacturing process for forming the recess on the rear surface of the semiconductor chip.

Referring to FIG. 11E, a first insulating layer 151 (also referred to as 'a rear insulating layer') including a first etching groove ER1 may be formed on the flat surface (flat surface FS of FIG. 11D) of the first semiconductor wafer WF1.

The first etching groove ER1 may be formed by etching at least a portion of a preliminary insulating layer formed on the insulating protective layer 113 and the buffer layer 114. The preliminary insulating layer may include, for example, silicon oxide (SiO) and/or silicon carbonitride (SiCN), and may be formed using a PVD or CVD process. The first etching groove ER1 may be formed using, for example, an etching process such as a reactive-ion etching (RIE) process using a photoresist (not illustrated).

Figure 11F:
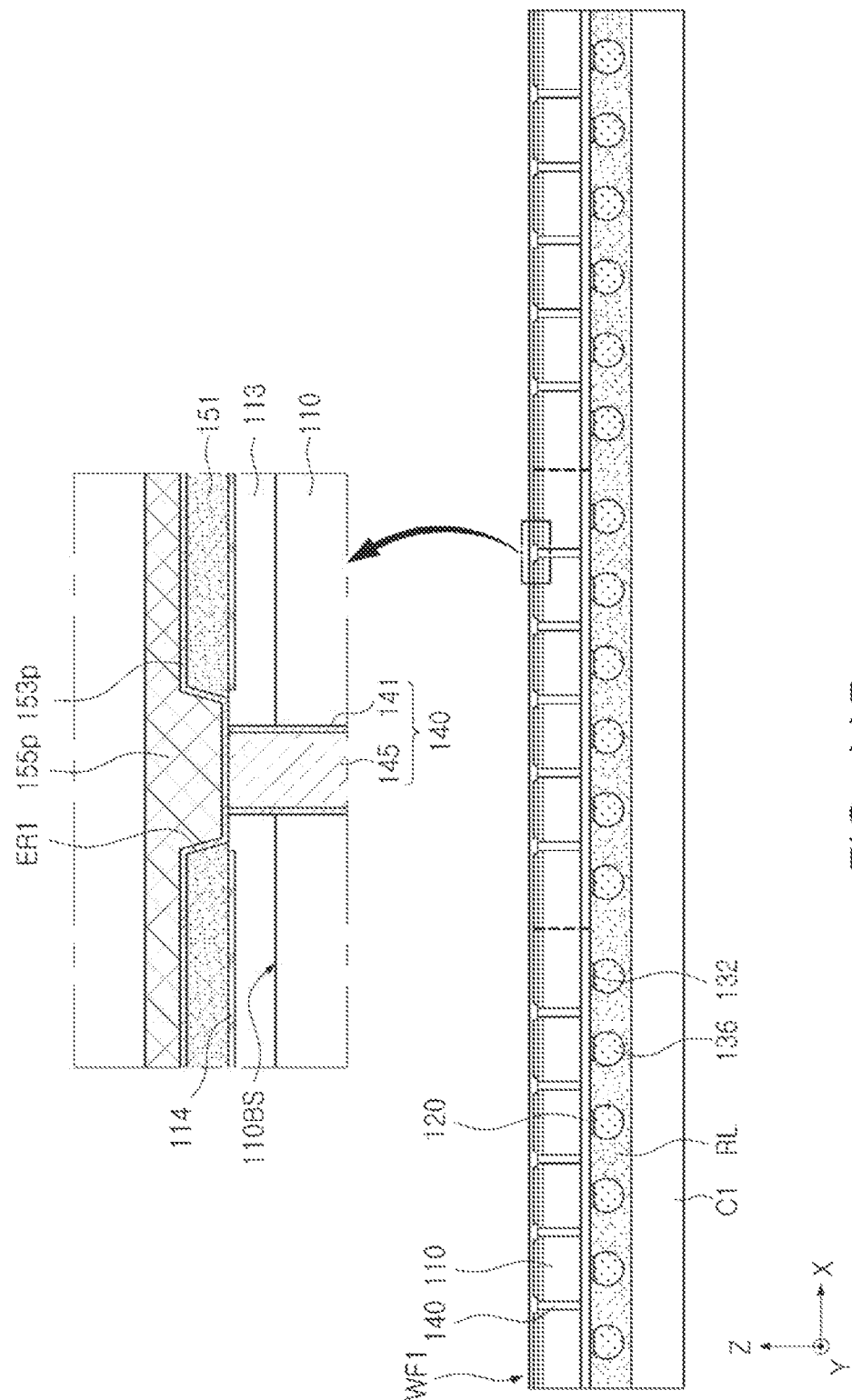
FIG. 11F is a sixth cross-sectional view illustrating the manufacturing process for forming the recess on the rear surface of the semiconductor chip.

Referring to FIG. 11F, a first preliminary barrier layer 153p and a first preliminary conductive layer 155p may be formed on a surface of the first insulating layer 151 and in the first etching groove ER1.

The first preliminary barrier layer 153p may be conformally formed along the surface of the first insulating layer 151. The first preliminary conductive layer 155p may be formed on the first preliminary barrier layer 153p, and may fill the first etching groove ER1. The first preliminary barrier layer 153p and the first preliminary conductive layer 155p may be formed using a plating process, a PVD process, or a CVD process. For example, the first preliminary barrier layer 153p may include titanium (Ti) or titanium nitride (TiN), and the first preliminary conductive layer 155p may include copper (Cu). A seed layer (not illustrated) including the same material as that of the first preliminary conductive layer 155p may be formed between the first preliminary barrier layer 153p and the first preliminary conductive layer 155p.

Figure 11G:
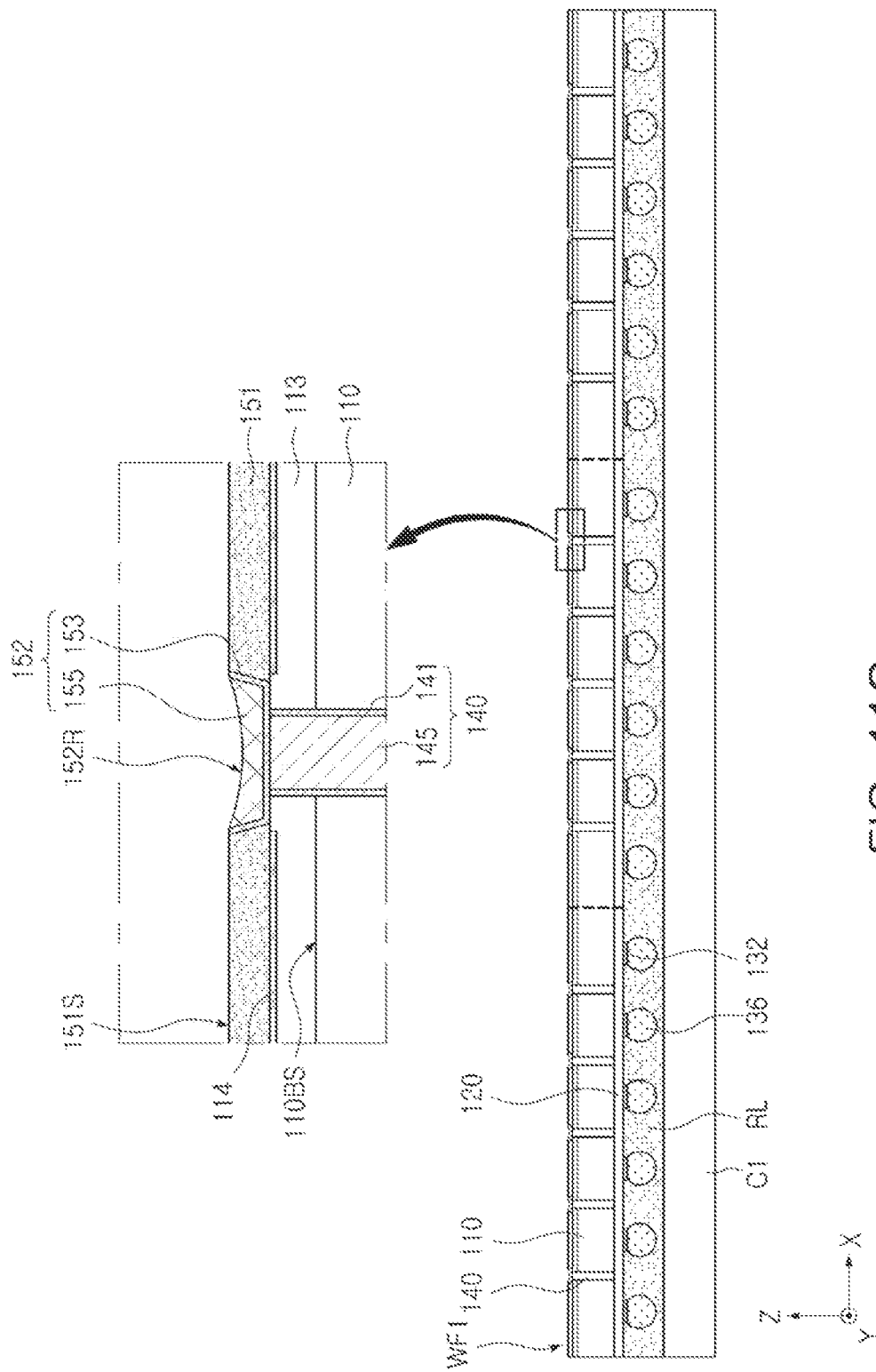
FIG. 11G is a seventh cross-sectional view illustrating the manufacturing process for forming the recess on the rear surface of the semiconductor chip.

Referring to FIG. 11G, first pads 152 (also referred to as 'rear pads') including a first barrier layer 153 and a first conductive layer 155 may be formed by polishing the first preliminary barrier layer 153p and the first preliminary conductive layer 155p.

A portion of the first preliminary barrier layer 153p and a portion of the first preliminary conductive layer 155p may be removed in a polishing process, to form at least one of the first pads 152 including the first barrier layer 153 and the first conductive layer 155. The polishing process may be performed using, for example, a CMP process using first slurry. The first slurry may have a polishing selectivity with respect to the first preliminary barrier layer 153p, the first preliminary conductive layer 155p, and the first insulating layer 151. For example, a third recess 152R recessed from an upper surface 151S of the first insulating layer 151 planarized by the polishing process may be formed on an upper surface of the one of the first pads 152. The third recess 152R may provide an expansion space for the first conductive layer 155 in a subsequent bonding process of the one of the first pads 152.

Figure 11H:
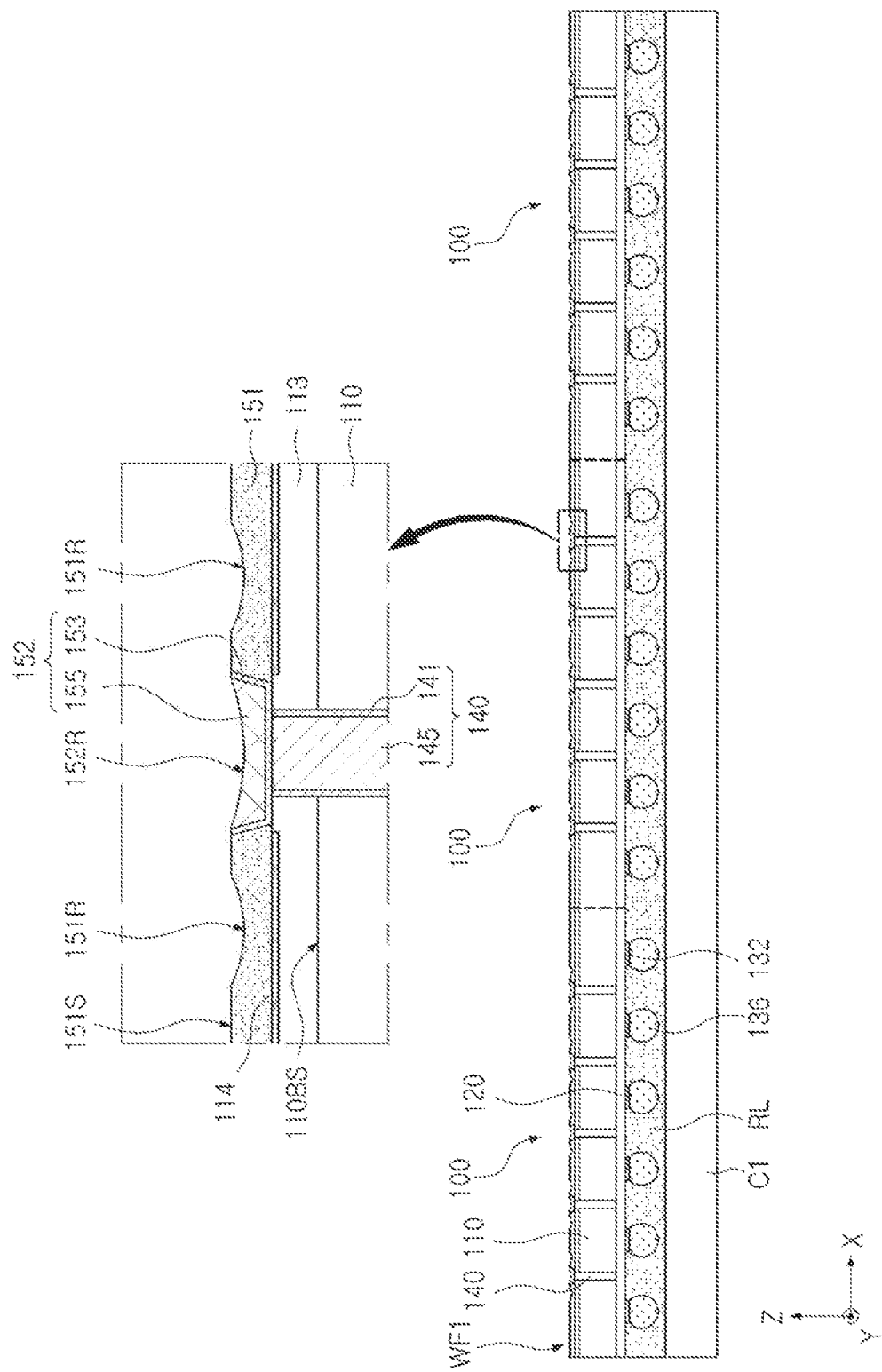
FIG. 11H is an eighth cross-sectional view illustrating the manufacturing process for forming the recess on the rear surface of the semiconductor chip.

Referring to FIG. 11H, the first insulating layer 151 may be polished to form a first recess 151R spaced apart from the one of the first pads 152 by a predetermined distance.

The polishing process may be performed using, for example, a CMP process using second slurry. The second slurry may have a polishing selectivity with respect to the first barrier layer 153, the first conductive layer 155, and the first insulating layer 151. For example, a polishing rate of the first insulating layer 151 with respect to the second slurry may be higher than a polishing rate of the first barrier layer 153 and the first conductive layer 155 with respect to the second slurry. Therefore, the first recess 151R of the first insulating layer 151, recessed in a downward direction, may be formed on the upper surface 151S of the first insulating layer 151.

FIGS. 12A to 12D are cross-sectional views illustrating a manufacturing process for forming a recess on a front surface of a semiconductor chip. FIGS. 12A to 12D illustrate a portion of a manufacturing process of the second semiconductor chip 200 illustrated in FIG. 1A, according to a process sequence.

Figure 12A:
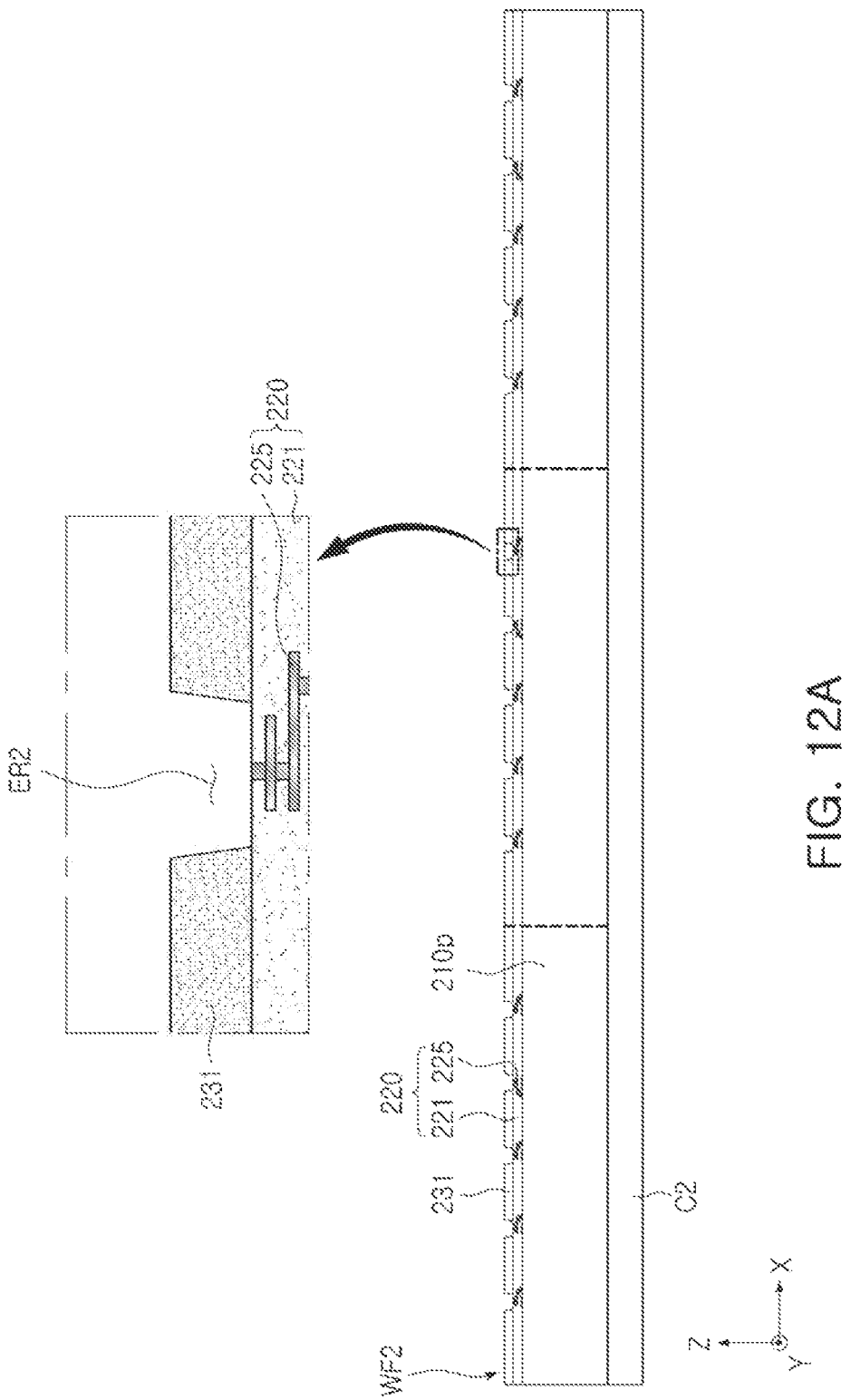
FIG. 12A is a first cross-sectional view illustrating a manufacturing process for forming a recess on a front surface of a semiconductor chip.

Referring to FIG. 12A, a second insulating layer 231 including a second etching groove ER2 may be formed on a second semiconductor wafer WF2.

The second semiconductor wafer WF2 may include a second preliminary substrate 210p, a second circuit layer 220 disposed on a front surface of the second preliminary substrate 210p, and a second insulating layer 231 disposed on the second circuit layer 220. The second semiconductor wafer WF2 may be supported by and temporarily joined to a second carrier substrate C2. The second etching groove ER2 may be formed by etching at least a portion of a preliminary insulating layer formed on the second circuit layer 220. The preliminary insulating layer may include, for example, silicon oxide (SiO) and/or silicon carbonitride (SiCN), and may be formed using a PVD or CVD process. The second etching groove ER2 may be formed using, for example, an etching process such as a reactive-ion etching (RIE) process using a photoresist (not illustrated).

Figure 12B:
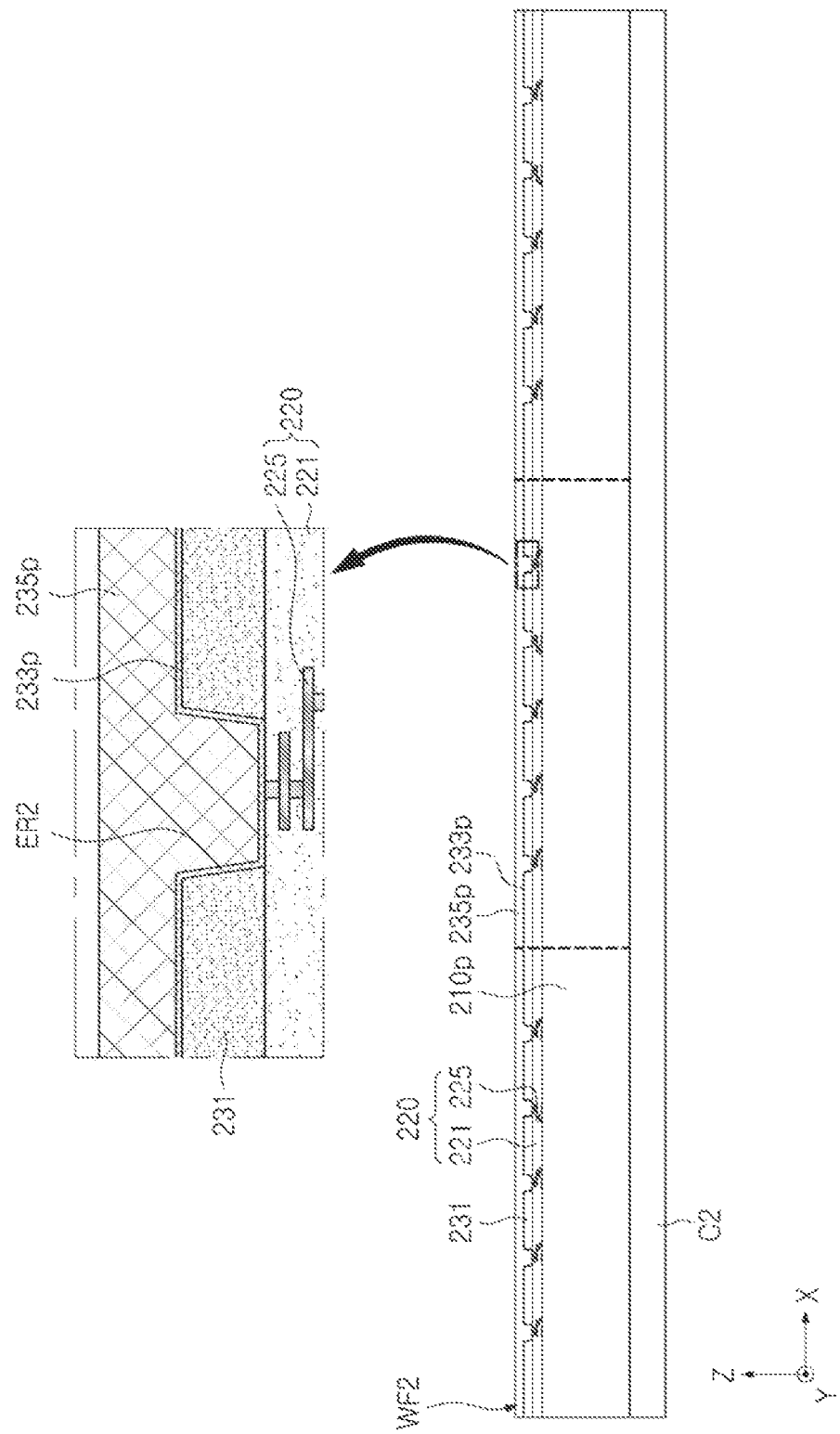
FIG. 12B is a second cross-sectional view illustrating the manufacturing process for forming the recess on the front surface of the semiconductor chip.

Referring to FIG. 12B, a second preliminary barrier layer 233p and a second preliminary conductive layer 235p may be formed on a surface of the second insulating layer 231 and in the second etching groove ER2.

The second preliminary barrier layer 233p may be conformally formed along the surface of the second insulating layer 231. The second preliminary conductive layer 235p may be formed on the second preliminary barrier layer 233p, and may fill the second etching groove ER2. The second preliminary barrier layer 233p and the second preliminary conductive layer 235p may be formed using a plating process, a PVD process, or a CVD process. For example, the second preliminary barrier layer 233p may include titanium (Ti) or titanium nitride (TiN), and the second preliminary conductive layer 235p may include copper (Cu). A seed layer (not illustrated) including the same material as that of the second preliminary conductive layer 235p may be formed between the second preliminary barrier layer 233p and the second preliminary conductive layer 235p.

Figure 12C:
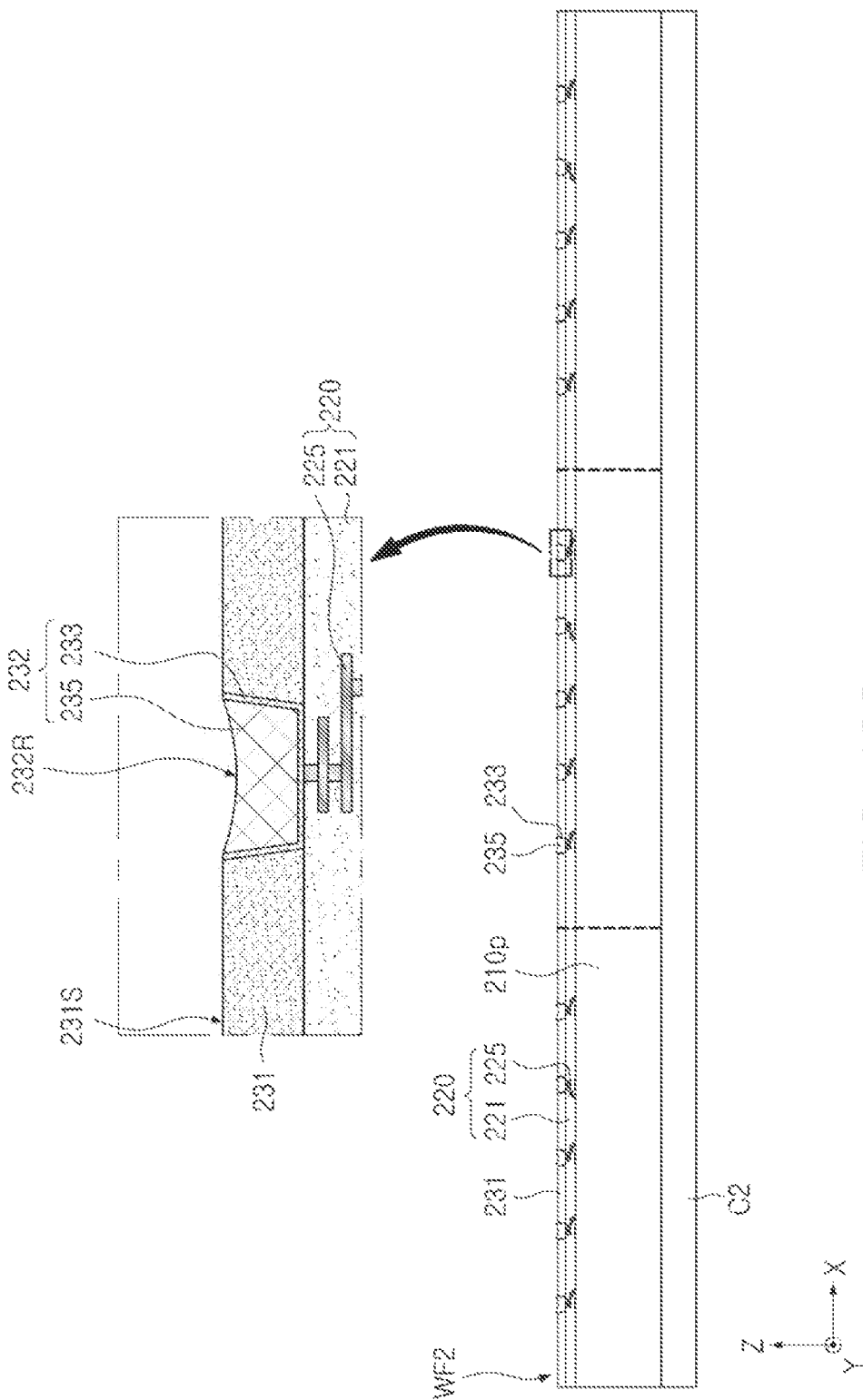
FIG. 12C is a third cross-sectional view illustrating the manufacturing process for forming the recess on the front surface of the semiconductor chip.

Referring to FIG. 12C, second pads 232 including a second barrier layer 233 and a second conductive layer 235 may be formed by polishing the second preliminary barrier layer 233p and the second preliminary conductive layer 235p.

A portion of the second preliminary conductive layer 235p and a portion of the second preliminary barrier layer 233p may be removed in a polishing process, to form the second pads 232 including the second conductive layer 235 and the second barrier layer 233. The polishing process may be performed using, for example, a CMP process using first slurry. The first slurry may have a polishing selectivity with respect to the second preliminary barrier layer 233p, the second preliminary conductive layer 235p, and the second insulating layer 231. For example, a polishing rate of the second insulating layer 231 with respect to the first slurry may be lower than a polishing rate of the second preliminary barrier layer 233p and the second preliminary conductive layer 235p with respect to the first slurry. For example, a fourth recess 232R recessed from an upper surface 231S of the second insulating layer 231 planarized by the polishing process may be formed on an upper surface of one of the second pads 232. The fourth recess 232R may provide an expansion space for the second conductive layer 235 in a subsequent bonding process of one of the second pads 232.

Figure 12D:
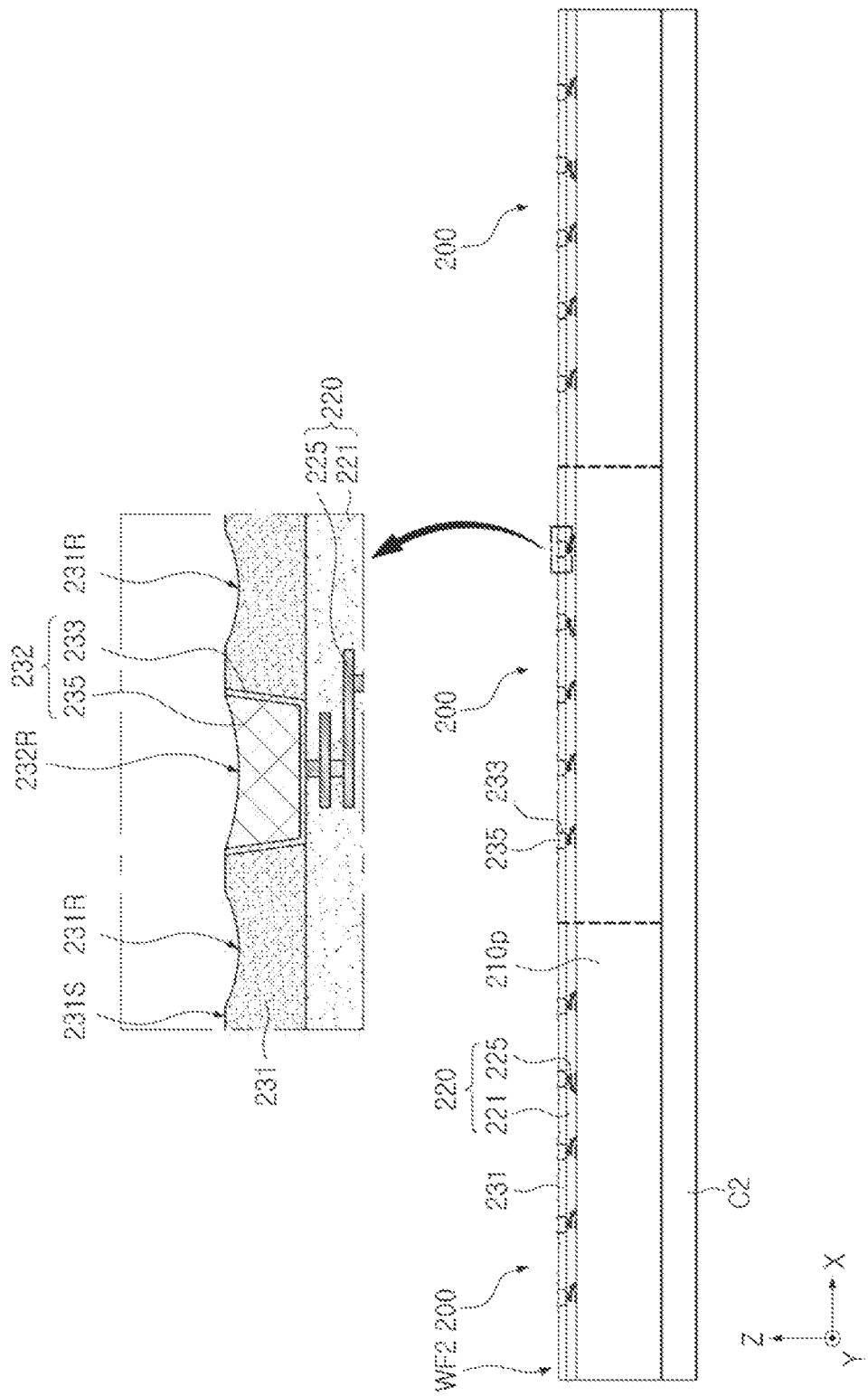
FIG. 12D is a fourth cross-sectional view illustrating the manufacturing process for forming the recess on the front surface of the semiconductor chip.

Referring to FIG. 12D, the second insulating layer 231 may be polished to form a second recess 231R spaced apart from one of the second pads 232 by a predetermined distance.

The polishing process may be performed using, for example, a CMP process using second slurry. The second slurry may have a polishing selectivity with respect to the second barrier layer 233, the second conductive layer 235, and the second insulating layer 231. For example, a polishing rate of the second insulating layer 231 with respect to the second slurry may be higher than a polishing rate of the second barrier layer 233 and the second conductive layer 235 with respect to the second slurry. For example, the second recess 231R of the second insulating layer 231, recessed in a downward direction, may be formed on the upper surface 231S of the second insulating layer 231. Thereafter, a plurality of the semiconductor chip 200 (or 'second semiconductor chips') having desired thicknesses may be formed by grinding a rear surface of the second preliminary substrate 210p.

Figure 13:
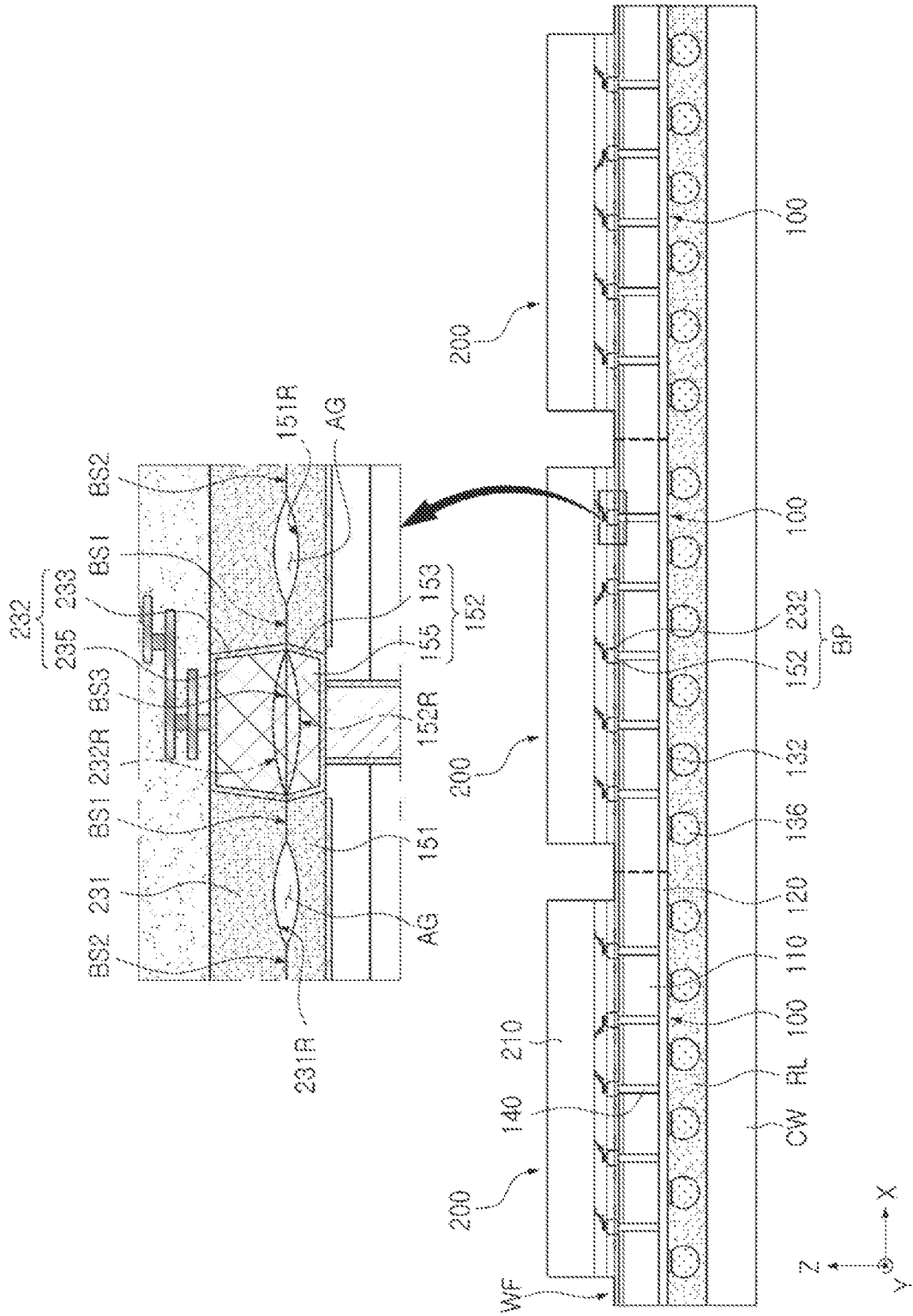
FIG. 13 is a cross-sectional view illustrating a manufacturing process of the semiconductor package of FIG. 1A.

FIG. 13 is a cross-sectional view illustrating a manufacturing process of the semiconductor package 10 of FIG. 1A.

Referring to FIG. 13, first, a semiconductor wafer WF provided for a plurality of a first semiconductor chip 100 may be prepared. The semiconductor wafer WF may be formed by the manufacturing process of FIGS. 11A to 11H. The semiconductor wafer WF may include a plurality of first pads 152 (also referred to as 'rear pads') and a first insulating layer 151 surrounding the plurality of first pads 152. The first insulating layer 151 may include a plurality of a first recess 151R spaced apart from the plurality of first pads 152. The semiconductor wafer WF may be supported on a temporary carrier CW by a junction material layer RL.

Next, a plurality of the second semiconductor chip 200 may be prepared. The plurality of the second semiconductor chip 200 may be formed by the manufacturing process of FIGS. 12A to 12D. The plurality of the second semiconductor chip 200 may include a plurality of second pads 232 and a second insulating layer 231 surrounding the plurality of second pads 232. The second insulating layer 231 may include a plurality of a second recess 231R spaced apart from the plurality of second pads 232. The semiconductor wafer WF and the plurality of the second semiconductor chip 200 may not be sequentially provided, but may be formed by an independent manufacturing process.

Next, the plurality of the second semiconductor chip 200 may be disposed on the semiconductor wafer WF. The plurality of the second semiconductor chip 200 may be disposed on the plurality of the first semiconductor chip 100 of the semiconductor wafer WF using, for example, a pick-and-place device. The plurality of the second semiconductor chip 200 may be aligned with the plurality of the first semiconductor chip 100 such that an air gap AG is formed between a first recess 151R and a second recess 231R. Therefore, the plurality of first pads 152 may be in contact with the plurality of second pads 232, and the first insulating layer 151 may be in contact with the second insulating layer 231 in a remaining portion, except for the air gap AG.

Next, a thermal compression process may be performed to bond the first insulating layer 151 and the second insulating layer 231, joined to each other, and bond the plurality of first pads 152 and the plurality of second pads 232, joined to each other. The thermal compression process may be performed such that the first insulating layer 151 and the second insulating layer 231 are first bonded and the plurality of first pads 152 and the plurality of second pads 232 are then bonded. For example, in the thermal compression process, the first insulating layer 151 and the second insulating layer 231 may be bonded in a thermal atmosphere having a temperature of about 100° C. to about 200° C., and the plurality of first pads 152 and the plurality of second pads 232 may be bonded in a thermal atmosphere having a temperature of about 200° C. to about 300° C. The temperature ranges of the thermal atmosphere are not limited to the above-described ranges (about 100° C. to about 300° C.), and may be variously changed. During the thermal compression process, a third recess 152R of the plurality of first pads 152 and a fourth recess 232R of the plurality of second pads 232 may expand to form a third bonding surface BS3 between the plurality of first pads 152 and the plurality of second pads 232. According to embodiments of the present disclosure, since a first bonding surface BS1 may be formed before the third bonding surface BS3 is formed, a junction region or an expansion region of one of the first pads 152 and one of second pads 232 may be limited by the first insulating layer 151 and the second insulating layer 231. Therefore, quality of a junction interface (the third bonding surface BS3) between the one of the first pads 152 and the one of the second pads 232 may be improved, and reliability of a bonding pad structure BP may be secured.

According to embodiments of the present disclosure, a semiconductor package having improved reliability and implementing a stack of semiconductor chips having a junction interface of excellent quality, by introducing an air gap spaced apart from a bonding pad structure, and a method of manufacturing the semiconductor package, may be provided.

While example embodiments have been illustrated and described above, it will be apparent to those skilled in the art that modifications and variations may be made without departing from the scope of the present disclosure.

What is claimed is:
1. A semiconductor package comprising:
   a first semiconductor chip comprising a first substrate, a first pad above the first substrate, and a first insulating layer above the first substrate and surrounding the first pad; and
   a second semiconductor chip on the first semiconductor chip, the second semiconductor chip comprising a second substrate, a second pad below the second substrate and contacting the first pad, and a second insulating layer below the second substrate, surrounding the second pad, and contacting the first insulating layer,
   wherein the first insulating layer comprises a first recess spaced apart from the first pad in a first direction,
   wherein the second insulating layer comprises a second recess spaced apart from the second pad in the first direction, the second recess overlapping at least a portion of the first recess in a second direction, perpendicular to the first direction, with an air gap between the first recess and the second recess, and
   wherein the semiconductor package further comprises:
      a first bonding surface that is defined by the first insulating layer and the second insulating layer contacting each other on one side of the air gap, adjacent to the first pad and the second pad; and
      a second bonding surface that is defined by the first insulating layer and the second insulating layer contacting each other on another side of the air gap, that is opposite to the one side.

2. The semiconductor package of claim 1, wherein the first recess and the first pad are spaced apart from each other by a first distance in the first direction,
   wherein the second recess and the second pad are spaced apart from each other by a second distance in the first direction, and
   wherein the first bonding surface has a length equal to or shorter than each of the first distance and the second distance in the first direction.

3. The semiconductor package of claim 2, wherein each of the first distance and the second distance is within a range from 0.1 nm to 500 nm.

4. The semiconductor package of claim 1, wherein each of the first recess and the second recess surrounds each of the first pad and the second pad on a plane.

5. The semiconductor package of claim 4, wherein each of the first recess and the second recess entirely surrounds each of the first pad and the second pad.

6. The semiconductor package of claim 1, wherein the first recess comprises a curved surface that is recessed from a first upper surface of the first insulating layer, facing the second semiconductor chip, toward a first lower surface of the first insulating layer that is opposite to the first upper surface, and
   wherein the second recess comprises a curved surface recessed from a second lower surface of the second insulating layer, facing the first semiconductor chip, toward a second upper surface of the second insulating layer that is opposite to the second lower surface.

7. The semiconductor package of claim 1, wherein the first recess comprises a first flat surface recessed from a first upper surface of the first insulating layer, facing the second semiconductor chip, toward a first lower surface of the first insulating layer that is opposite to the first upper surface, and
   wherein the second recess comprises a second flat surface recessed from a second lower surface of the second insulating layer, facing the first semiconductor chip, toward a second upper surface of the second insulating layer that is opposite to the second lower surface.

8. The semiconductor package of claim 1, wherein the second insulating layer comprises a lower insulating layer directly contacting the first insulating layer, and an upper insulating layer on the lower insulating layer,
   wherein the lower insulating layer comprises an insulating material that is different from an insulating material of the first insulating layer.

9. The semiconductor package of claim 8, wherein the first insulating layer comprises silicon oxide (SiO), and
   wherein the lower insulating layer of the second insulating layer comprises silicon carbonitride (SiCN).

10. The semiconductor package of claim 8, wherein the second recess has a depth equal to or less than a thickness of the lower insulating layer.

11. The semiconductor package of claim 1, wherein the first pad comprises a first conductive layer and a first barrier layer surrounding a side surface of the first conductive layer, and
    wherein the second pad comprises a second conductive layer contacting at least a portion of the first conductive layer, and further comprises a second barrier layer surrounding a side surface of the second conductive layer.

12. The semiconductor package of claim 11, wherein the first conductive layer comprises a first groove exposing at least a portion of the first barrier layer, and
    wherein the second conductive layer comprises a second groove exposing at least a portion of the second barrier layer.

13. The semiconductor package of claim 1, wherein the first semiconductor chip further comprises a first circuit layer below the first substrate, a lower pad below the first circuit layer, and a first through-electrode that passes through the first substrate and is electrically connected to the first pad and the lower pad.

14. A semiconductor package comprising:
    a first semiconductor chip comprising a first substrate, a plurality of first pads above the first substrate, and a first insulating layer above the first substrate and surrounding the plurality of first pads,
    a second semiconductor chip on the first semiconductor chip, the second semiconductor chip comprising a second substrate, a plurality of second pads below the second substrate, and a second insulating layer below the second substrate and surrounding the plurality of second pads,
    wherein the first semiconductor chip and the second semiconductor chip are electrically connected to each other by a pair of a first bonding pad structure and a second bonding pad structure that each comprise one of the plurality of first pads and one of the plurality of second pads,
    wherein the semiconductor package further comprises a first air gap that surrounds the first bonding pad structure, and a second air gap that surrounds the second bonding pad structure, and
    wherein the semiconductor package further comprises:
       first bonding surfaces that are defined by at least a portion of the first insulating layer and at least a portion of the second insulating layer that are in contact with each other, between the first bonding pad structure and the first air gap and between the second bonding pad structure and the second air gap; and a second bonding surface that is defined by at least a portion of the first insulating layer and at least a portion of the second insulating layer that are in contact with each other, between the first air gap and the second air gap.

15. The semiconductor package of claim 14, wherein each of the first bonding surfaces has a length that is less than a width of each of the first air gap and the second air gap.

16. The semiconductor package of claim 15, wherein the width of each of the first air gap and the second air gap is 5% to 25% of an interval between the first bonding pad structure and the second bonding pad structure.

17. The semiconductor package of claim 14, wherein the second bonding surface has a length that is equal to or greater than a sum of a width of the first air gap and a width of the second air gap.

18. A semiconductor package comprising:
a first semiconductor chip comprising a first substrate, a first pad above the first substrate, and a first insulating layer comprising a first recess that surrounds the first pad in a first direction and a second direction, opposite of the first direction; and
a second semiconductor chip on the first semiconductor chip, the second semiconductor chip comprising a second substrate, a second pad below the second substrate and contacting the first pad, and a second insulating layer comprising a second recess that surrounds the second pad in the first direction and the second direction,
wherein the second insulating layer contacts the first insulating layer, and
wherein a side surface of each of the first pad and the second pad is entirely covered with the first insulating layer and the second insulating layer, respectively.

19. The semiconductor package of claim 18, wherein at least a portion of the first insulating layer is located between the side surface of the first pad and the first recess, and
wherein at least a portion of the second insulating layer is located between the side surface of the second pad and the second recess.

20. The semiconductor package of claim 19, wherein the portion of the first insulating layer is in contact with the portion of the second insulating layer.

* * * * *